US012795966B2

(12) United States Patent
Sakurai et al.

(10) Patent No.: US 12,795,966 B2
(45) Date of Patent: Nov. 10, 2026

(54) SEMICONDUCTOR DEVICE

(71) Applicant: FUJI ELECTRIC CO., LTD., Kanagawa (JP)

(72) Inventors: Yosuke Sakurai, Azumino-city (JP); Seiji Noguchi, Matsumoto-city (JP); Kosuke Yoshida, Matsumoto-city (JP); Ryutaro Hamasaki, Matsumoto-city (JP); Takuya Yamada, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 292 days.

(21) Appl. No.: 18/542,814

(22) Filed: Dec. 18, 2023

(65) Prior Publication Data

US 2024/0128362 A1 Apr. 18, 2024

Related U.S. Application Data

(63) Continuation of application No. PCT/JP2023/001201, filed on Jan. 17, 2023.

(30) Foreign Application Priority Data

Jan. 20, 2022 (JP) ................................ 2022-006926

(51) Int. Cl.
*H10D 12/00* (2025.01)
*H10D 62/10* (2025.01)
(Continued)

(52) U.S. Cl.
CPC ......... *H10D 12/481* (2025.01); *H10D 62/113* (2025.01); *H10D 62/393* (2025.01);
(Continued)

(58) Field of Classification Search
CPC .. H10D 12/481; H10D 12/038; H10D 62/113; H10D 62/393; H10D 62/105;
(Continued)

(56) References Cited

U.S. PATENT DOCUMENTS

| | | | |
|---|---|---|---|
| 7,470,953 | B2 | 12/2008 | Takaya |
| 9,252,251 | B2 | 2/2016 | Hirler |

(Continued)

FOREIGN PATENT DOCUMENTS

| | | | |
|---|---|---|---|
| CN | 113054012 | A | 6/2021 |
| EP | 3422416 | A1 | 1/2019 |

(Continued)

OTHER PUBLICATIONS

Extended European Search Report for counterpart European Application No. 23743248.9, issued by the European Patent Office on Oct. 29, 2024.

(Continued)

*Primary Examiner* — Marc-Anthony Armand

(57) ABSTRACT

Provided is a semiconductor device comprising: a plurality of trench portions include a gate trench portion and a dummy trench portion; a first lower end region of a second conductivity type that is provided to be in contact with lower ends of two or more trench portions which include the gate trench portion; a well region of a second conductivity type that is arranged in a different location from the first lower end region in a top view, and a second lower end region of a second conductivity type that is provided between the first lower end region and the well region in a top view being separated from the first lower end region and the well region, and provided to be in contact with lower ends of one or more trench portions including the gate trench portion.

20 Claims, 19 Drawing Sheets

(51) Int. Cl.
*H10D 62/17* (2025.01)
*H10D 64/01* (2025.01)
*H10D 84/00* (2025.01)

(52) U.S. Cl.
CPC ......... *H10D 64/017* (2025.01); *H10D 62/105* (2025.01); *H10D 84/144* (2025.01)

(58) Field of Classification Search
CPC .... H10D 62/127; H10D 62/145; H10D 62/60; H10D 62/107; H10D 64/017; H10D 64/117; H10D 84/144; H10D 84/811
See application file for complete search history.

(56) References Cited

U.S. PATENT DOCUMENTS

| | | | | |
|---|---|---|---|---|
| 10,319,808 | B2 | 6/2019 | Naito | |
| 2004/0178441 | A1 | 9/2004 | Yanagisawa | |
| 2006/0289928 | A1 | 12/2006 | Takaya | |
| 2008/0001217 | A1 | 1/2008 | Kawashima | |
| 2012/0056241 | A1 | 3/2012 | Sumitomo | |
| 2014/0084332 | A1 | 3/2014 | Lee | |
| 2014/0217464 | A1 | 8/2014 | Higuchi | |
| 2015/0021658 | A1* | 1/2015 | Lee ...................... | H10D 12/481 257/140 |
| 2015/0162407 | A1 | 6/2015 | Laven | |
| 2015/0221756 | A1 | 8/2015 | Vellei | |
| 2015/0295034 | A1 | 10/2015 | Laven | |
| 2016/0204097 | A1 | 7/2016 | Laven | |
| 2016/0211257 | A1 | 7/2016 | Yoshida | |
| 2016/0225884 | A1 | 8/2016 | Hirler | |
| 2016/0359026 | A1 | 12/2016 | Matsuura | |
| 2016/0372586 | A1 | 12/2016 | Fujii | |
| 2017/0018633 | A1 | 1/2017 | Baburske | |
| 2017/0018637 | A1 | 1/2017 | Kitamura | |
| 2017/0117397 | A1 | 4/2017 | Mauder | |
| 2018/0019319 | A1 | 1/2018 | Baburske | |
| 2018/0286971 | A1 | 10/2018 | Philippou | |
| 2019/0006496 | A1 | 1/2019 | Kanda | |
| 2019/0051739 | A1 | 2/2019 | Naito | |
| 2019/0123185 | A1 | 4/2019 | Vellei | |
| 2019/0123186 | A1 | 4/2019 | Philippou | |
| 2019/0165163 | A1 | 5/2019 | Kobayashi | |
| 2019/0305083 | A1 | 10/2019 | Dainese | |
| 2019/0305087 | A1 | 10/2019 | Philippou | |
| 2020/0144149 | A1* | 5/2020 | Kubouchi ............ | H10D 84/811 |
| 2020/0357904 | A1 | 11/2020 | Ozaki | |
| 2021/0043759 | A1 | 2/2021 | Philippou | |
| 2021/0296487 | A1 | 9/2021 | Fujisawa | |
| 2023/0071170 | A1 | 3/2023 | Toshiyuki | |
| 2023/0124922 | A1 | 4/2023 | Ozaki | |
| 2023/0261095 | A1 | 8/2023 | Ikura | |
| 2023/0268342 | A1 | 8/2023 | Ikura | |
| 2024/0120413 | A1 | 4/2024 | Sakurai | |

FOREIGN PATENT DOCUMENTS

| | | | |
|---|---|---|---|
| JP | 2001230414 | A | 8/2001 |
| JP | 2005142243 | A | 6/2005 |
| JP | 2010010556 | A | 1/2010 |
| JP | 4500530 | B2 | 7/2010 |
| JP | 2010251608 | A | 11/2010 |
| JP | 2012080074 | A | 4/2012 |
| JP | 2013084922 | A | 5/2013 |
| JP | 2014064005 | A | 4/2014 |
| JP | 2016131224 | A | 7/2016 |
| JP | 2016225566 | A | 12/2016 |
| JP | 2018037696 | A | 3/2018 |
| JP | 2018182313 | A | 11/2018 |
| JP | 2019012762 | A | 1/2019 |
| JP | 2019033208 | A | 2/2019 |
| JP | 2019091892 | A | 6/2019 |
| JP | 2019102554 | A | 6/2019 |
| JP | 2019110288 | A | 7/2019 |
| JP | 2019216223 | A | 12/2019 |
| JP | 2021150406 | A | 9/2021 |
| WO | 2016042955 | A1 | 3/2016 |
| WO | 2022123923 | A1 | 6/2022 |
| WO | 2022158053 | A1 | 7/2022 |
| WO | 2022239284 | A1 | 11/2022 |
| WO | 2022239285 | A1 | 11/2022 |

OTHER PUBLICATIONS

Extended European Search Report for related European Application No. 23743247.1, issued by the European Patent Office on Oct. 29, 2024.
International Search Report and Written Opinion (ISA/237) of the International Search Authority for International Patent Application No. PCT/JP2023/001201, mailed by the Japan Patent Office on Apr. 11, 2023.
International Search Report and Written Opinion (ISA/237) of the International Search Authority for International Patent Application No. PCT/JP2023/001200, mailed by the Japan Patent Office on Apr. 11, 2023.
Office Action issued for related U.S. Appl. No. 18/542,817, mailed by the United States Patent and Trademark Office on Jul. 24, 2026.
Office Action issued for related Japanese Application No. 2024-203215, transmitted from the Japanese Patent Office on Sep. 1, 2026.

* cited by examiner

SEMICONDUCTOR DEVICE

The contents of the following patent application(s) are incorporated herein by reference:

NO. 2022-006926 filed in JP on Jan. 20, 2022

NO. PCT/JP2023/001201 filed in WO on Jan. 17, 2023

BACKGROUND

1. Technical Field

The present invention relates to a semiconductor device.

2. Related Art

A structure has been hitherto known in which a floating region of a P type away from a well region of the P type is provided at a bottom portion of a gate trench (see Patent Document 1, for example).

Patent Document 1: Japanese Patent Application Publication No. 2019-91892

DESCRIPTION OF EXEMPLARY EMBODIMENTS

Figure 1:
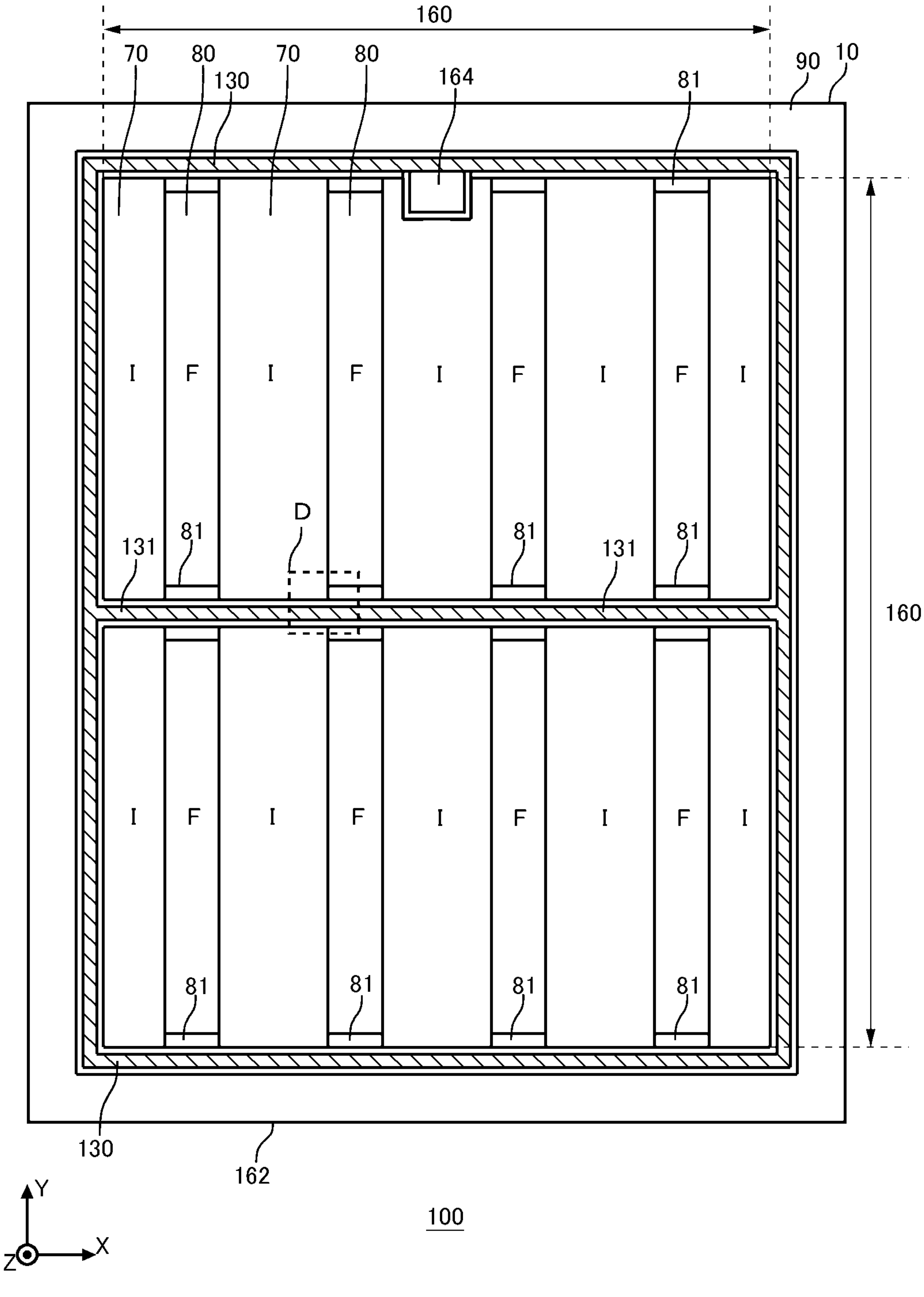
FIG. 1 illustrates a top view showing an example of a semiconductor device 100 according to one embodiment of the present invention.

Hereinafter, the present invention will be described through embodiments of the invention, but the following embodiments do not limit the invention according to claims. In addition, not all of the combinations of features described in the embodiments are essential to the solution of the invention.

As used herein, one side in a direction parallel to a depth direction of a semiconductor substrate is referred to as “upper” and the other side is referred to as “lower”. One surface of two principal surfaces of a substrate, a layer or other member is referred to as an upper surface, and the other surface is referred to as a lower surface. “Upper” and “lower” directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate a height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, a case where a term such as “same” or “equal” is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D-N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the semiconductor substrate of the present specification, bulk donors of the N type are distributed throughout. The bulk donor is a dopant donor substantially uniformly contained in an ingot during the manufacture of the ingot from which the semiconductor substrate is made. The bulk donor of this example is an element other than hydrogen. The dopant of the bulk donor is, for example, phosphorous, antimony, arsenic, selenium, or sulfur, but the present invention is not limited to these. The bulk donor of this example is phosphorous. The bulk donor is also contained in a region of the P type. The semiconductor substrate may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), or a float zone method (FZ method). The ingot of this example is manufactured by the MCZ method. An oxygen concentration contained in the substrate manufactured by the MCZ method is $1\times10^{17}$ to $7\times10^{17}/cm^3$. The oxygen concentration contained in the substrate manufactured by the FZ method is $1\times10^{15}$ to $5\times10^{16}/cm^3$. When the oxygen concentration is high, hydrogen donors tend to be easily generated. The bulk donor concentration may use a chemical concentration of bulk donors distributed throughout the semiconductor substrate, or may be a value from 90% to 100% of the chemical concentration. In addition, as the semiconductor substrate, a non-doped substrate not containing a dopant such as phosphorous may be used. In that case, the bulk donor concentration (D0) of the non-doped substrate is, for example, from $1\times10^{10}/cm^3$ or more and to $5\times10^{12}/cm^3$ or less. The bulk donor concentration (D0) of the non-doped substrate is preferably $1\times10^{11}/cm^3$ or more. The bulk donor concentration (D0) of the non-doped substrate is preferably $5\times10^{12}/cm^3$ or less. Each concentration in the present invention may be a value at room temperature. As the value at room temperature, a value at 300 K (Kelvin) (about 26.9° C.) may be used as an example.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type. In the specification, a unit system is the SI base unit system unless otherwise particularly noted. Although a unit of length may be expressed in cm, calculations may be carried out after conversion to meters (m).

A chemical concentration in the present specification indicates an atomic density of an impurity measured regardless of an electrical activation state. The chemical concentration can be measured by, for example, secondary ion mass spectrometry (SIMS). The net doping concentration described above can be measured by capacitance-voltage profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of an N type, the donor concentration is sufficiently higher than the acceptor concentration, and thus the carrier concentration of the region may be set as the donor concentration. Similarly, in a region of a P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/$cm^3$ or/$cm^3$ is used to indicate a concentration per unit volume. This unit is used for a concentration of a donor or an acceptor in a semiconductor substrate, or a chemical concentration. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately from 0.1% to 10% of a chemical concentration of hydrogen.

FIG. 1 illustrates a top view showing an example of a semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1. The active portion 160 may refer to a region that overlaps with the emitter electrode in the top view. In addition, a region sandwiched by the active portion 160 in the top view may also be included in the active portion 160.

The active portion 160 is provided with a transistor portion 70 including a transistor element such as an IGBT (Insulated Gate Bipolar Transistor). The active portion 160 may further be provided with a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. The semiconductor device 100 of this example is a reverse-conducting IGBT (RC-IGBT).

In FIG. 1, a region where each of the transistor portions 70 is arranged is indicated by a symbol "I", and a region where each of the diode portions 80 is arranged is indicated by a symbol "F". In the present specification, a direction perpendicular to the array direction in a top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is greater than the width in the X axis direction. Similarly, the length of each of the diode portions 80 in the Y axis direction is greater than the width in the X axis direction. The extending direction of the transistor portion 70 and the diode portion 80, and a longitudinal direction of each trench portion which will be described below may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of the P+ type may be provided in a region other than the cathode region. In the present specification, the diode portion 80 may also include an extension region 81 where the diode portion 80 extends to a gate runner to be described later in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 164. The semiconductor device 100 may have a pad such as an anode pad, a cathode pad, and a current detection pad. Each pad is arranged in a region close to the end side 162. The region close to the end side 162 refers to a region between the end side 162 and the emitter electrode in the top view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner that connects the gate pad 164 and the gate trench portion. In FIG. 1, the gate runner is hatched with diagonal lines.

The gate runner of the present example includes an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of the present example encloses the active portion 160 in the top view. A region enclosed by the outer circumferential gate runner 130 in the top view may be the active portion 160. In addition, a well region is formed below the gate runner. The well region is a region of the P type having a higher concentration than the base region described below, and is formed to a position deeper than the base region from the upper surface of the semiconductor substrate 10. A region surrounded by the well region in the top view may be the active portion 160.

The outer circumferential gate runner 130 is connected to the gate pad 164. The outer circumferential gate runner 130 is arranged above the semiconductor substrate 10. The outer circumferential gate runner 130 may be a metal wiring containing aluminum or the like.

The active-side gate runner 131 is provided in the active portion 160. Providing the active-side gate runner 131 in the active portion 160 can reduce a variation in wiring length from the gate pad 164 for each region of the semiconductor substrate 10.

The outer circumferential gate runner 130 and the active-side gate runner 131 are connected to the gate trench portion of the active portion 160. The outer circumferential gate runner 130 and the active-side gate runner 131 are arranged above the semiconductor substrate 10. The outer circumferential gate runner 130 and the active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 sandwiching the active portion 160, substantially at the center of the Y axis direction. When the active portion 160 is divided by the active-side gate runner 131, the transistor portion 70 and the diode portion 80 may be alternately arranged in the X axis direction in each of the divided regions.

In addition, the semiconductor device 100 may include a temperature sensing portion (not shown) which is a PN junction diode formed of polysilicon or the like, and a current detection portion (not shown) which simulates an operation of the transistor portion provided in the active portion 160.

The semiconductor device 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, or a RESURF annularly provided to enclose the active portion 160.

Figure 2:
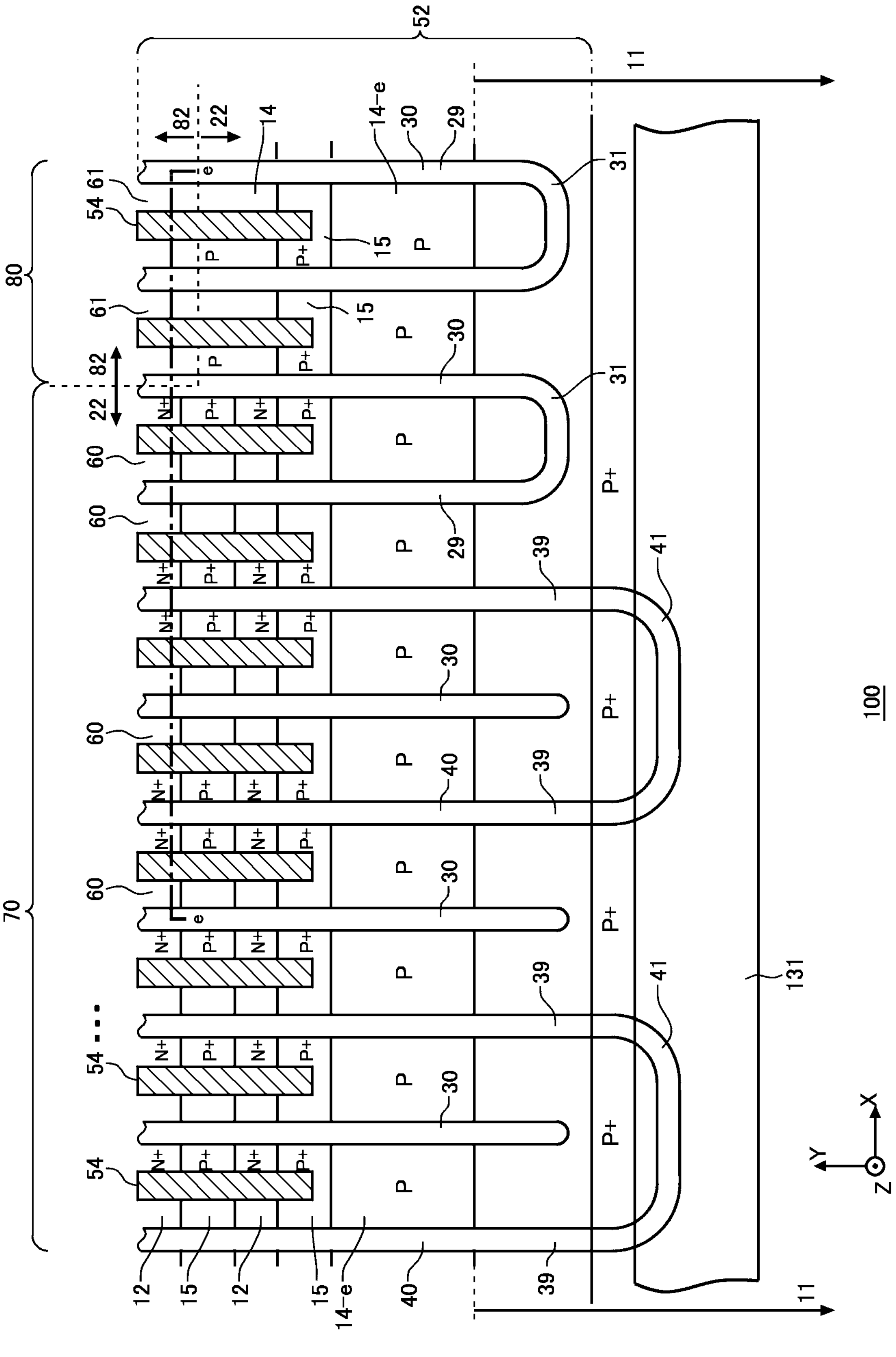
FIG. 2 is an enlarged drawing of a region D in FIG. 1.

FIG. 2 is an enlarged drawing of a region D in FIG. 1. The region D is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside on the upper surface side of the semiconductor substrate 10. The gate trench portion 40 and the dummy trench portion 30 each are an example of the trench portion. In addition, the semiconductor device 100 of the present example includes an emitter electrode 52 and the active-side gate runner 131 which are provided above the upper surface of the semiconductor substrate 10. The emitter electrode 52 and the active-side gate runner 131 are provided separate from each other.

Between the emitter electrode 52 and the active-side gate runner 131, and the upper surface of the semiconductor substrate 10, an interlayer dielectric film is provided, but an illustration thereof is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at an edge of the dummy trench portion 30 in the Y axis direction or the like. Alternatively, the dummy conductive portion of the dummy trench portion 30 may not be connected to the emitter electrode 52 and the gate conductive portion, and may be controlled to have a different potential from a potential of the emitter electrode 52 and a potential of the gate conductive portion.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material including metal. FIG. 2 shows a range where the emitter electrode 52 is provided. For example, at least a part of a region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided so as to overlap with the active-side gate runner 131. The well region 11 is provided so as to extend with a predetermined width also in a range not overlapping with the active-side gate runner 131. The well region 11 of this example is provided away from an end of the contact hole 54 in the Y axis direction toward the active-side gate runner 131 side. The well region 11 is a second conductivity type region having a higher doping concentration than the base region 14. The base region 14 of the present example is of the P− type, and the well region 11 is of the P+ type.

Each of the transistor portion 70 and the diode portion 80 includes a plurality of trench portions arranged in the array direction. In the transistor portion 70 of the present example, one or more gate trench portions 40 and one or more dummy trench portions 30 are alternately provided along the array direction. In the diode portion 80 of the present example, the plurality of dummy trench portions 30 are provided along the array direction. In the diode portion 80 of this example, the gate trench portion 40 is not provided.

The gate trench portion 40 of the present example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is preferably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom of each trench portion in the depth direction is covered with the well region 11 at the end portion of each trench portion in the Y axis direction. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of the present example is provided so as to extend in the extending direction (the Y axis direction) along the trench, on the upper surface of the semiconductor substrate 10. In the present example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-*e*. While FIG. 2 shows the base region 14-*e* arranged at one end portion of each mesa portion in the extending direction, the base region 14-*e* is also arranged at the other end portion of each mesa portion. In each mesa portion, at least one of the emitter region 12 of the first conductivity type or the contact region 15 of the second conductivity type may be provided in the region sandwiched between the base regions 14-*e* in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 of the mesa portion 60 are alternately arranged along the extending direction of the trench portion (the Y axis direction).

In another example, the contact region 15 and the emitter region 12 of the mesa portion 60 may be provided in a stripe pattern along the extending direction of the trench portion (the Y axis direction). For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided on an upper surface of the mesa portion 61. The contact region 15 may be provided in contact with each of the base regions 14-*e* in a region sandwiched between the base regions 14-*e* on the upper surface of the mesa portion 61. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-*e*. The contact hole 54 of this example is provided above respective regions of the contact region 15, the base region 14, and the emitter region 12. The contact hole 54 is not provided in regions corresponding to the base region 14-*e* and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region 22 of the P+ type may be provided in a region where the cathode region 82 is not provided. The cathode region 82 and the collector region 22 are provided between the lower surface 23 of the semiconductor substrate 10 and a buffer region 20. In FIG. 2, a boundary between the cathode region 82 and the collector region 22 is indicated by a dotted line.

The cathode region 82 is arranged apart from the well region 11 in the Y axis direction. With this configuration, a distance between the P type region (the well region 11) which has a relatively high doping concentration and is formed to a deep position and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
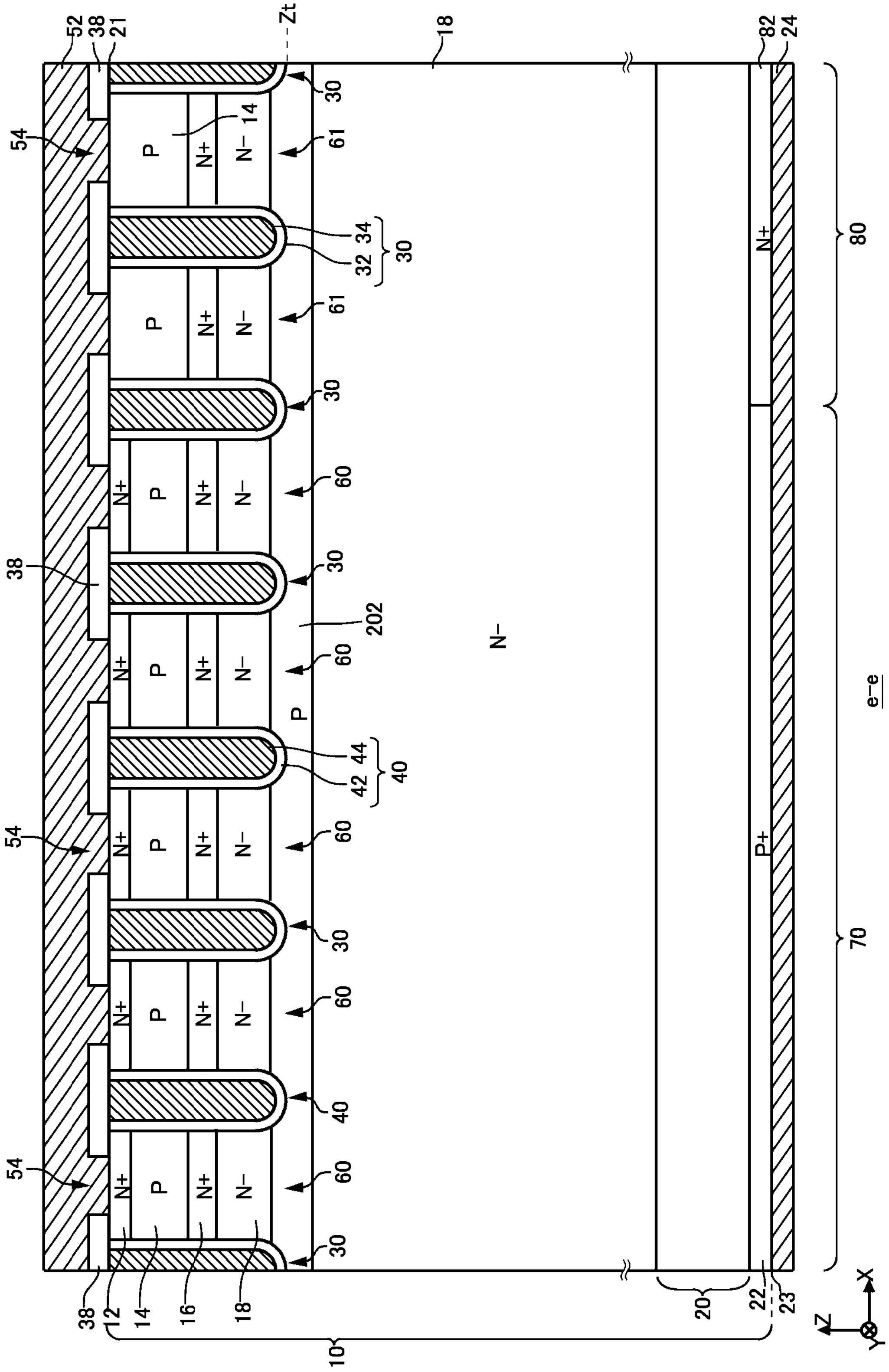
FIG. 3 illustrates a view showing an example of a cross section e-e in FIG. 2.

FIG. 3 is a drawing showing an example of a cross section e-e in FIG. 2. The cross section e-e is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the z axis direction) is referred to as a depth direction.

The semiconductor substrate 10 includes an N type or N− type drift region 18. The drift region 18 is provided in each of the transistor portion 70 and the diode portion 80.

In the mesa portion 60 of the transistor portion 70, an N+ type of emitter region 12 and a P− type of base region 14 are provided in order from an upper surface 21 side of the semiconductor substrate 10. The drift region 18 is provided below the base region 14. The mesa portion 60 may be provided with an N+ type accumulation region 16. The accumulation region 16 is arranged between the base region 14 and the drift region 18.

The emitter region 12 is exposed on the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. That is, the accumulation region 16 has a higher donor concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover an entire lower surface of the base region 14 in each mesa portion 60.

The mesa portion 61 of the diode portion 80 is provided with the P− type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 may have a concentration peak having a higher doping concentration than the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may have two or more concentration peaks in the depth direction (Z axis direction) of the semiconductor substrate 10. The concentration peak of the buffer region 20 may be provided at the same depth position as, for example, a chemical concentration peak of hydrogen (a proton) or phosphorous. The buffer region 20 may function as a field stopper layer which prevents a depletion layer expanding from the lower end of the base region 14 from reaching the collector region 22 of the P+ type and the cathode region 82 of the N+ type.

In the transistor portion 70, the collector region 22 of the P+ type is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and is provided to below the base region 14. In a region where at least any one of the emitter region 12, the contact region 15, and the accumulation region 16 is provided, each trench portion also passes through the doping regions of these. The configuration of the trench portion penetrating through the doping region is not limited to that manufactured in the order of forming the doping region and then forming the trench portion. The configuration of the trench portion passing through the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as those of the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon or the like. The dummy conductive portion 34 may have the same length as that of the gate conductive portion 44 in the depth direction.

The gate trench portion 40 and the dummy trench portion 30 of this example are covered with the interlayer dielectric film 38 on the upper surface 21 of the semiconductor substrate 10. Note that the bottoms of the dummy trench portion 30 and the gate trench portion 40 may be formed in a curved-surface shape (a curved shape in the cross section) convexly downward. In the present specification, a depth position of a lower end of the gate trench portion 40 is set as Zt.

The semiconductor device 100 of the present example includes a P type first lower end region 202 which is provided to be in contact with the lower end of the trench portion. A doping concentration of the first lower end region 202 may be equal to or less than a doping concentration of the base region 14. A doping concentration of the first lower end region 202 of the present example is lower than a doping concentration of the base region 14. A P type dopant may be boron or may be aluminum.

The first lower end region 202 is arranged apart from the base region 14. An N type region (in the present example, at least one of the accumulation region 16 or the drift region 18) is provided between the first lower end region 202 and the base region 14.

The first lower end regions 202 are provided in series to be in contact with the lower end of two or more trench portions in an X axis direction. That is, the first lower end region 202 is provided to cover a mesa portion between the trench portions. The first lower end region 202 may cover a plurality of mesa portions. The first lower end region 202 of the present example is provided to be in contact with the lower end of each of the two or more trench portions including the gate trench portion 40.

The first lower end region 202 may be in contact with the lower end of each of the two or more trench portions in the respective transistor portions 70. Also, the first lower end region 202 may be in contact with the lower end of each of the two or more gate trench portions 40 in the respective transistor portions 70. The first lower end region 202 may be in contact with the lower end of each of the two or more dummy trench portions 30 in the respective transistor portions 70. The first lower end region 202 may be in contact with the lower end of each of all the trench portions in at least one transistor portion 70. Also, the first lower end region 202 may be in contact with the lower end of each of all the gate trench portions 40 in at least one transistor portion 70.

The first lower end region 202 may be in contact with the lower end of each of the two or more trench portions in the respective diode portions 80. The first lower end region 202 may be in contact with the lower end of each of all the trench portions in at least one diode portion 80.

The first lower end region 202 is provided to extend in a Y axis direction. A length of the first lower end region 202 in the Y axis direction is shorter than a length of the trench portion in the Y axis direction. Also, the length of the first lower end region 202 in the Y axis direction may be 50% or more, may be 70% or more, may be 90% or more of the length of the trench portion in the Y axis direction.

By providing the first lower end region 202, a potential increase near the lower end of the trench portion when the semiconductor device 100 is turned on can be suppressed. Thus, it is possible to reduce a slope (dv/dt) of a waveform of emitter-collector voltage at the time of turn-on and to reduce noise in a voltage or current waveform at the time of switching.

Note that a potential of the first lower end region 202 is different from a potential of the emitter electrode 52. As described above, the first lower end region 202 is arranged, in a Z axis direction, apart from the base region 14 which is connected to the emitter electrode 52. Also, the first lower end region 202 is arranged, in a top view, apart from the well region which is connected to the emitter electrode 52. The active portion 160 may have a portion to which the first lower end region 202 is not provided in at least one of the X axis direction or the Y axis direction. The first lower end region 202 may be an electrically floating region to which no electrode is connected.

Figure 4:
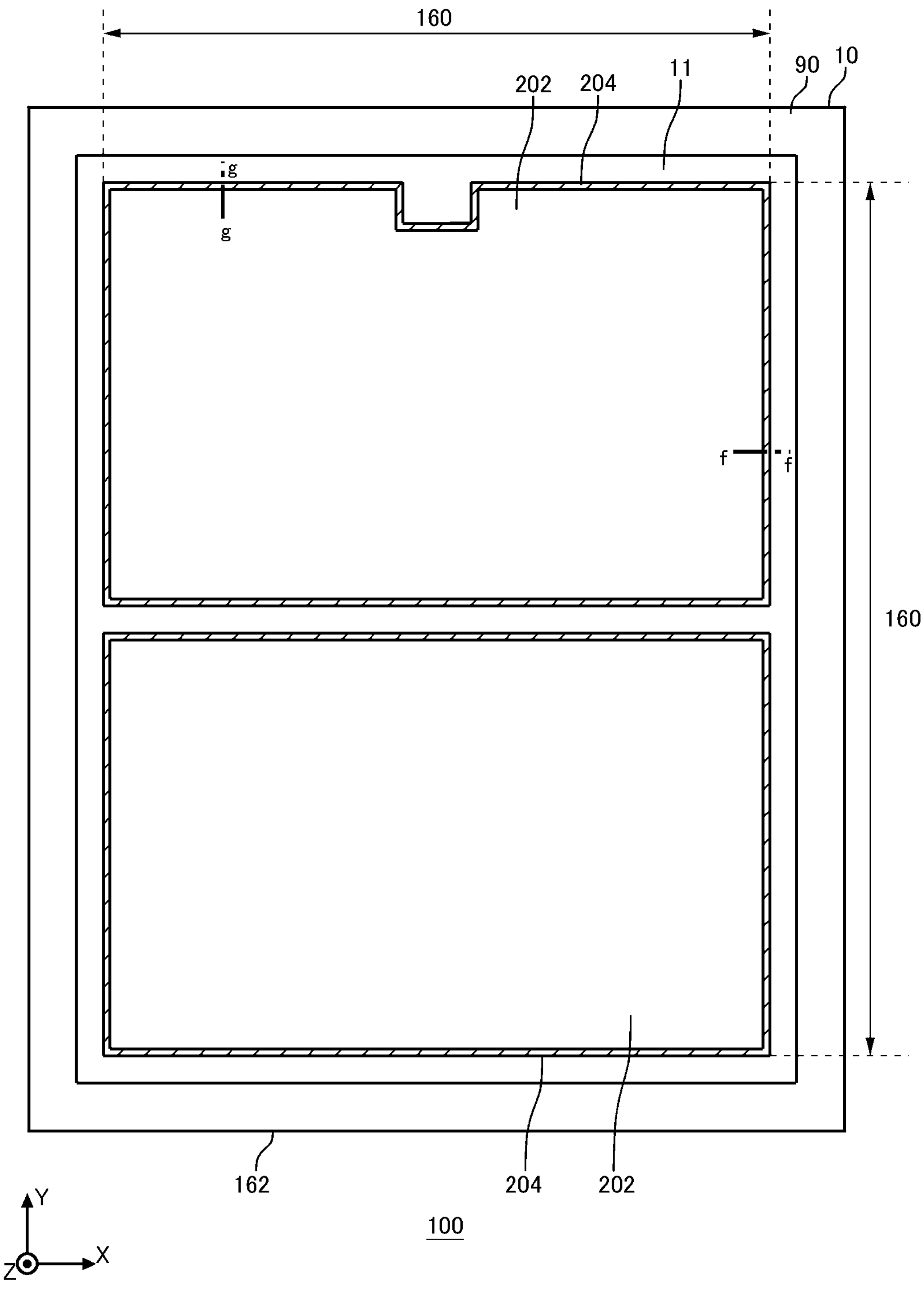
FIG. 4 shows an exemplary arrangement of a well region 11 and a first lower end region 202 in a top view.

FIG. 4 shows an exemplary arrangement of a well region 11 and a first lower end region 202 in a top view. The first lower end region 202 of the present example is provided in the active portion 160. The first lower end region 202 may be provided in an area of 50% or more, may be provided in an area of 70% or more, or may be provided in an area of 90% or more of the active portion 160 in a top view.

The well region 11 is provided below the gate runner shown in the FIG. 1. In a top view, the well region 11 and the first lower end region 202 are arranged in different locations. As shown in FIG. 4, in a top view, the well region 11 may be arranged to surround the first lower end region 202. As shown in FIG. 4, when the first lower end region 202 is divided into a plurality of regions, the well region 11 may surround the respective first lower end regions 202.

In a top view, an isolation region 204 is provided between the well region 11 and the first lower end region 202. The isolation region 204 includes an N type region which separates the well region 11 and the first lower end region 202. The N type region is, for example, a drift region 18. The N type region is arranged to surround the first lower end region 202 in a top view. The well region 11 is arranged to surround the isolation region 204 in a top view. In FIG. 4, the isolation region 204 is hatched with diagonal lines. By providing the isolation region 204 between the well region 11 and the first lower end region 202, the first lower end region 202 is prevented from having the same potential as that of the well region 11. In this way, the first lower end region 202 is suppressed from having an emitter potential, and the transistor portion 70 and the diode portion 80 can be operated.

In the present example, the isolation region 204 is provided in the entire area in the active portion 160 in which the first lower end region 202 is not provided. Note that when there exists a portion inside the active portion 160 in which the first lower end region 202 is not provided, the portion may also be provided with the isolation region 204. The isolation region 204 arranged inside the active portion 160 may be surrounded by the first lower end region 202 in a top view.

Figure 5:
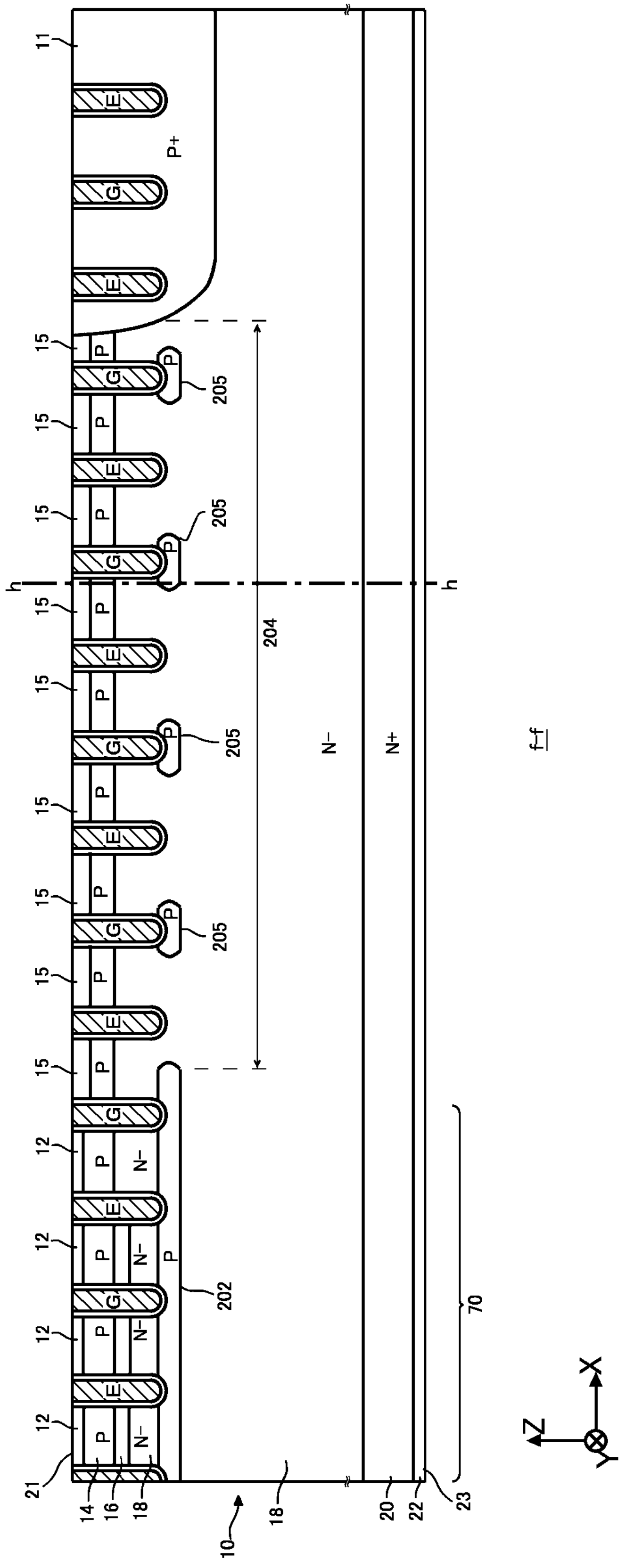
FIG. 5 shows an example of the cross section f-f in FIG. 4.

FIG. 5 shows an example of a cross section f-f in FIG. 4. The cross section f-f is an XZ plane which passes through the first lower end region 202, the isolation region 204 and the well region 11. That is, the cross section f-f is the XZ plane in the vicinity of a boundary between the active portion 160 and the well region 11. Note that FIG. 5 shows a structure of the semiconductor substrate 10 and omits components such as an electrode and a dielectric film arranged above and below the semiconductor substrate 10. Also, FIG. 5 shows the gate trench portion 40 with a symbol G and the dummy trench portion 30 with a symbol E.

The cross section f-f shown in FIG. 5 includes a transistor portion 70 which is arranged at the endmost in the X axis direction among a plurality of transistor portions 70. A structure of the transistor portion 70 is similar to that of the transistor portion 70 described in FIG. 2 and FIG. 3. Note that in FIG. 5, one dummy trench portion 30 is arrayed between two gate trench portions 40 as G/E/G/E/ . . . , but two dummy trench portions 30 may be arrayed between two gate trench portions 40 as G/E/E/G/E/E/ . . . . An array of the gate trench portions 40 and the dummy trench portions 30 may have another structure. Also, a plurality of trench portions of the isolation region 204 may be arranged with a constant interval in the X axis direction. The interval between the trench portions of the isolation region 204 may be the same as the interval between the trench portions of the transistor portion 70.

The first lower end region 202 is provided at the lower end of the trench portion of the transistor portion 70. A center of the gate trench portion 40 (G) arranged at the end in the X axis direction among the gate trench portions 40 (G) provided in direct contact with the emitter regions 12 is defined as an end portion of the transistor portion 70 in the X axis direction. The first lower end region 202 may extend outward farther than the transistor portion 70 in the X axis direction. That is, the first lower end region 202 may extend to a region in which a gate structure including the gate trench portion 40 and the emitter region 12 is not provided.

The well region 11 is provided from the upper surface 21 of the semiconductor substrate 10 to below the base region 14. The well region 11 is a region of a P+ type having a higher doping concentration than the base region 14.

A region between the first lower end region 202 and the well region 11 in a top view is referred to as an isolation region 204. The isolation region 204 is provided with one or more trench portions. The isolation region 204 of the present example is provided with one or more gate trench portions 40 and one or more dummy trench portions 30. The arrangement of the trench portions of the isolation region 204 in the X axis direction may be the same as or may be different from that of the transistor portion 70.

Each mesa portion of the isolation region 204 is provided with the base region 14. The contact region 15 may be provided between the base region 14 and the upper surface 21 of the semiconductor substrate 10. Also, the emitter region 12 may be provided between the base region 14 and the upper surface 21 of the semiconductor substrate 10. Also, the mesa portion of the isolation region 204 may be provided with or may not be provided with an accumulation region 16. For example, the accumulation region 16 may be provided in one or more mesa portions located to be the closest to the transistor portion 70 among the mesa portions of the isolation region 204.

The first lower end region 202 of the present example is a P type region having a doping concentration lower than that of the well region 11. The first lower end region 202 is arranged in at least a partial region of the transistor portion 70. The first lower end region 202 of the present example extends closer to the well region 11 than the end portion of the transistor portion 70. In another example, the first lower end region 202 may be terminated at the end portion of the transistor portion 70 or may be terminated inside the transistor portion 70.

The isolation region 204 has one or more second lower end regions 205. The second lower end region 205 is a second conductivity type region provided to be in contact with the lower ends of one or more trench portions each including a gate trench portion 40. A doping concentration of the second lower end region 205 may be higher than, may be lower than, or may be the same as that of the first lower end region 202.

The second lower end regions 205 may be provided in series along an extending direction of the trench portion (the Y axis direction). A length of the second lower end region 205 in the Y axis direction may be the same as a length of the first lower end region 202 in the Y axis direction, or may be 80% or more or 120% or less of a length of the first lower end region 202 in the Y axis direction. The second lower end region 205 may be provided discretely along the extending direction of the trench portion (the Y axis direction).

The second lower end region 205 is provided between the first lower end region 202 and the well region 11 in a top view. The second lower end region 205 of the present example is provided between the first lower end region 202 and the well region 11 in the X axis direction. The second lower end region 205 is provided to be separated from the first lower end region 202 and the well region 11. An N type region such as a drift region 18 is provided between the second lower end region 205 and the first lower end region 202 in a top view. An N type region such as a drift region 18 is provided between the second lower end region 205 and the well region 11 in a top view. Also, when a plurality of second lower end regions 205 are provided, an N type region such as a drift region 18 is provided between two second lower end regions 205 in a top view.

In the X axis direction, a distance between the first lower end region 202 and the second lower end region 205 may be greater than or may be less than a width of the mesa portion in the isolation region 204. Also, in the X axis direction, a distance between adjacent two second lower end regions 205 may be greater than or may be less than a width of the mesa portion in the isolation region 204.

Also, in the X axis direction, a distance between the well region 11 and the second lower end region 205 may be greater than or may be less than a width of the mesa portion in the isolation region 204.

Note that a potential of the second lower end region 205 is different from a potential of the emitter electrode 52. The second lower end region 205 is arranged, in the Z axis direction, apart from the base region 14 which is connected to the emitter electrode 52. Also, the second lower end region 205 is arranged, in a top view, apart from the well region 11 which is connected to the emitter electrode 52. The second lower end region 205 may be an electrically floating region to which no electrode is connected.

As described above, by providing the first lower end region 202, a potential increase near the lower end of the trench portion when the semiconductor device 100 is turned on can be suppressed. Thus, it is possible to reduce a slope (dv/dt) of a waveform of emitter-collector voltage at the time of turn-on and to reduce noise in a voltage or current waveform at the time of switching. Also, by providing the isolation region 204, the first lower end region 202 and the well region 11 can be separated from each other, and the transistor portion 70 and the diode portion 80 can be operated. On the other hand, an imbalance occurs between an electric field near the lower end of the trench portion of a region in which the first lower end region 202 exists and an electric field near the lower end of the trench portion of a region in which the first lower end region 202 does not exist. In particular, due to an electric field strength near the lower end of the gate trench portion 40 where the first lower end region 202 is not provided, an avalanche can easily be generated and a clamp withstand capability and a latch-up resistance decrease.

Meanwhile, in the semiconductor device 100, the second lower end region 205 is provided at the lower end of at least one of the gate trench portion 40 in the isolation region 204. In this way, the electric field strength near the lower end of the gate trench portion 40 of the isolation region 204 can be relaxed. Thus, the breakdown voltage or the withstand capability of the semiconductor device 100 can be improved.

The second lower end region 205 may be provided for each of two or more gate trench portions 40 of the isolation region 204. Each of the second lower end regions 205 is separated from each other. In the example of FIG. 5, the second lower end region 205 is provided at the lower end of each of all the gate trench portions 40 in the isolation region 204. In the present example, each second lower end region 205 is in contact with the lower end of one of the gate trench portions 40 and not in contact with the lower end of another one of the gate trench portions 40 other than the above-described one of the gate trench portions 40. In the example of FIG. 5, each second lower end region 205 is in contact with the lower end of one of the gate trench portions 40, and not in contact with the lower end of the other trench portions. A width of the second lower end region 205 in the X axis direction may be less than, may be the same as, or may be larger than a width of the gate trench portion 40 in the X axis direction. The second lower end region 205 preferably covers the lowest part of the gate trench portion 40 (for example, the bottom surface of the gate trench portion 40).

The second lower end region 205 may have a portion which is provided at a same depth position as the first lower end region 202. That is, a range in the Z axis direction in which the second lower end region 205 is provided and a range in the Z axis direction in which the first lower end region 202 is provided may at least partially overlap. At least one of the drift region 18 or the accumulation region 16 may be arranged between the second lower end region 205 and the base region 14.

Figure 6:
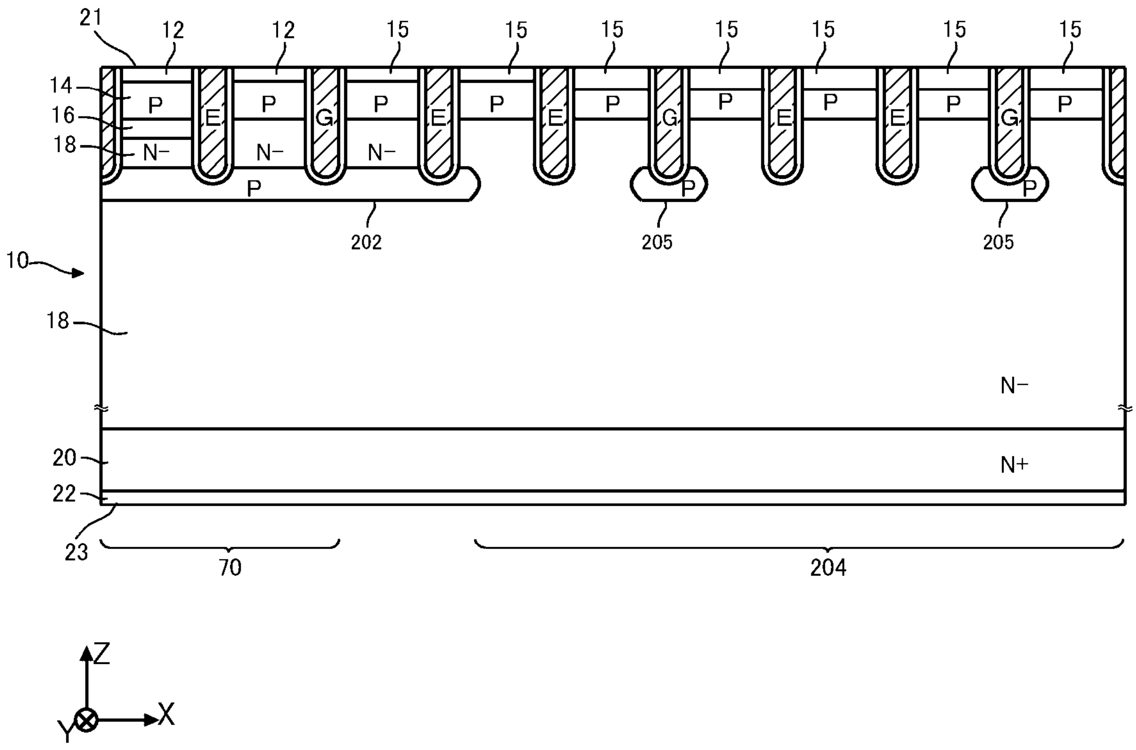
FIG. 6 shows another array example of the gate trench portion 40 and the dummy trench portion 30.

FIG. 6 shows another array example of the gate trench portion 40 and the dummy trench portion 30. The active portion 160 of the present example is provided with two dummy trench portions 30 between two gate trench portions 40. Also, the gate trench portions 40 are not arranged in series in the X axis direction. That is, one gate trench portion 40 and two dummy trench portions 30 are alternately arranged. Other structures are similar to those in the examples described in FIG. 1 to FIG. 5. Also in the present example, the one or more gate trench portions 40 of the isolation region 204 are provided with the second lower end region 205.

Also in the example of any of FIG. 5 or FIG. 6, the number of trench portions in contact with one of the second lower end regions 205 is less than the number of trench portions in contact with one of the first lower end regions 202. For example, in the example of FIG. 6, while the number of trench portions in contact with one of the second lower end regions 205 is 1, one of the first lower end regions 202 is in contact with a plurality of trench portions. One of the first lower end regions 202 may be in contact with lower ends of a plurality of gate trench portions 40 and a plurality of dummy trench portions 30.

Figure 7:
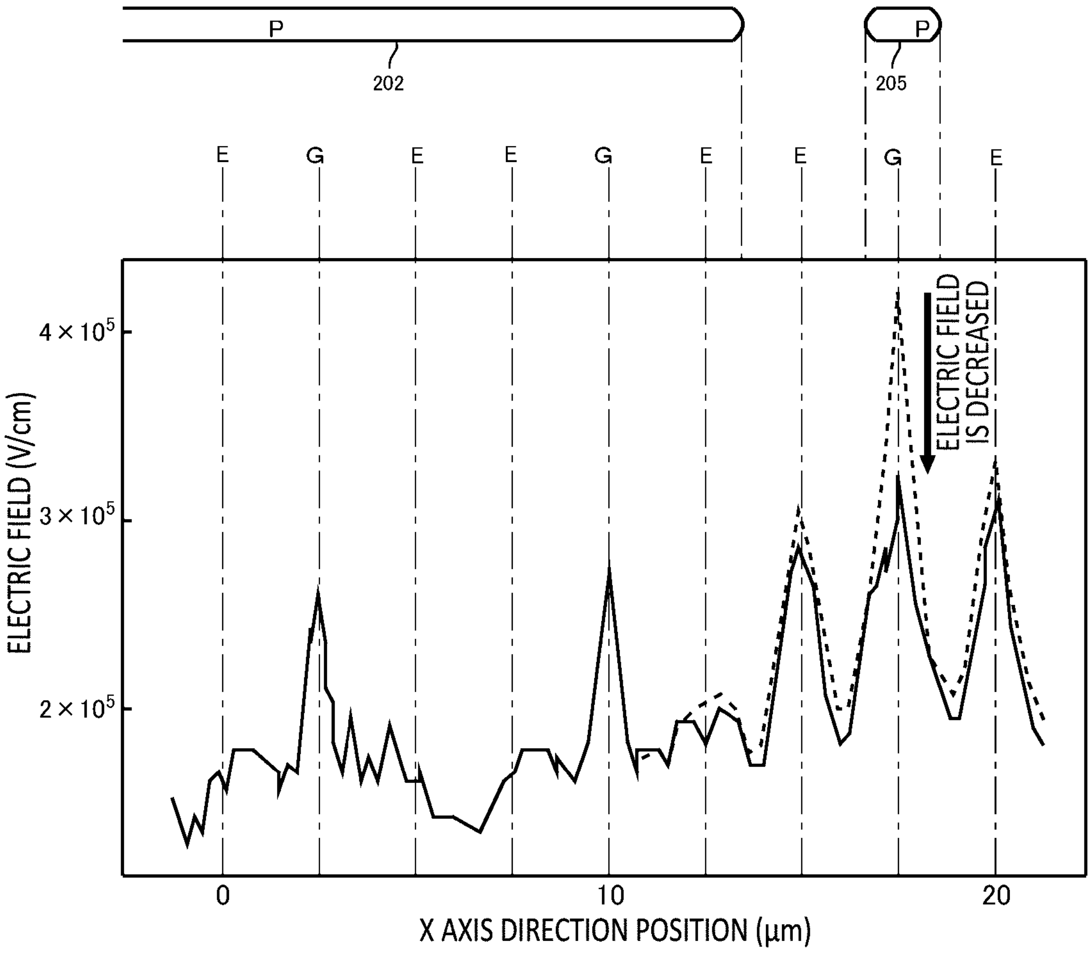
FIG. 7 shows a distribution example of an electric field at a depth position of the lower end of the trench portion in an X axis direction.

FIG. 7 shows a distribution example of an electric field at a depth position of the lower end of the trench portion in an X axis direction. FIG. 7 shows an electric field distribution when a transistor portion 70 in which a current five times or more (six times in the present example) of the rated current flows is turned off. FIG. 7 shows a position of the lower end of the gate trench portion 40 in the X axis direction with a symbol G, and shows a position of the lower end of the dummy trench portion 30 in the X axis direction with a symbol E. Also, it schematically shows positions in the X axis direction in which the first lower end region 202 and the second lower end region 205 are provided. Note that the solid lines in FIG. 7 are an electric field distribution when the first lower end region 202 and the second lower end region 205 are provided as shown in FIG. 6, and the dashed line is an electric field distribution when the second lower end region 205 is not provided and only the first lower end region 202 is provided.

When the second lower end region 205 is not provided, as shown with the dashed line of FIG. 7, the electric field at the lower end of the trench portion which is not covered by the first lower end region 202 increases. In particular, the electric field strength at the lower end of the gate trench portion 40 (G) significantly increases. Thus, due to an electric field strength near the lower end of the gate trench portion 40, an avalanche can easily be generated and a clamp withstand capability and a latch-up resistance decrease.

Meanwhile, by providing the second lower end region 205, as shown with the solid lines of FIG. 7, the electric field near the lower end of the gate trench portion 40 can be decreased. Thus, the breakdown voltage and the withstand capability of the semiconductor device 100 can be improved.

Figure 8:
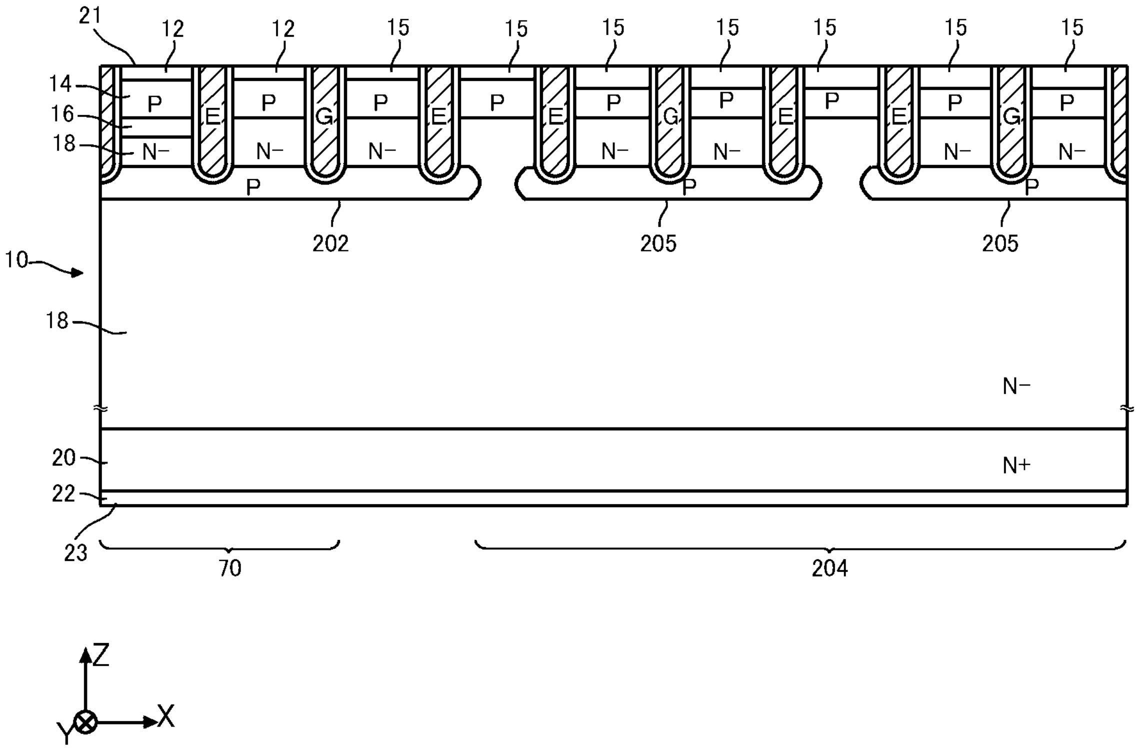
FIG. 8 shows another example of the second lower end region 205.

FIG. 8 shows another example of the second lower end region 205. The second lower end region 205 of the present example is in contact with the lower end of one of the gate trench portions 40, and is in contact with the lower end of the dummy trench portion 30 which is arranged adjacent to the gate trench portion 40 in the X axis direction. In the example of FIG. 8, the second lower end region 205 is in contact with the lower end of one of the gate trench portions 40, and in contact with the lower ends of two dummy trench portions 30 with the gate trench portion 40 sandwiched therebetween in the X axis direction. At least a portion below the mesa portion 60 which is sandwiched by two adjacent dummy trench portions 30 is not provided with the second lower end region 205. That is, two second lower end regions 205 provided at the two adjacent dummy trench portions 30 are separated from each other. In a top view, an N type region is provided between the separated two second lower end region 205. The N type region is, for example, a drift region 18. By such a configuration, an electric field strength near the lower ends of these dummy trench portions 30 can be relaxed. Thus, the breakdown voltage and the withstand capability of the semiconductor device 100 can be further improved.

Figure 9A:
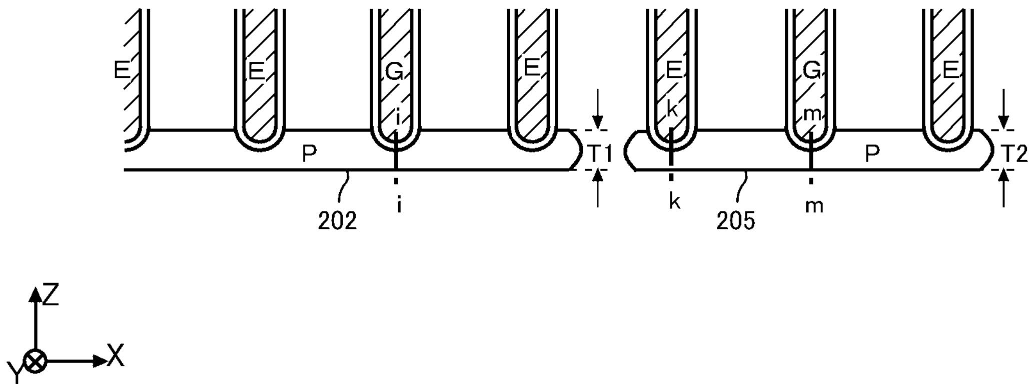
FIG. 9A shows an enlarged drawing of a region near the first lower end region 202 and the second lower end region 205.

FIG. 9A is an enlarged drawing showing a region near the first lower end region 202 and the second lower end region 205. The second lower end region 205 of the present example is in contact with the lower end of a plurality of trench portions. A doping concentration of the second lower end region 205 at the lower end of the gate trench portion 40 is referred to as Dg. The doping concentration Dg may be the maximum value or may be an average value obtained by dividing an integrated value $I_D g$ of a doping concentration of the second lower end region 205 on a line m-m which passes through the lowest point of the gate trench portion 40 and which is parallel to the Z axis, with a width T2 of a depth direction to the lower end from the upper end of the second lower end region 205. Similarly, a doping concentration of the second lower end region 205 at the lower end of the dummy trench portion 30 is referred to as Dd. The doping concentration Dd may be an average value or may be the maximum value obtained by dividing an integrated value $I_D d$ of a doping concentration of the second lower end region 205 on a line k-k which passes through the lowest point of the dummy trench portion 30 and which is parallel to the Z axis, with a width T2 of a depth direction of the lower end from the upper end of the second lower end region 205.

The doping concentration Dg may be greater than the doping concentration Dd. The integrated value $I_D g$ may be greater than the integrated value $I_D d$. As shown in FIG. 7, since an electric field strength can more easily occur in the gate trench portion 40 than in the dummy trench portion 30, by increasing the doping concentration Dg or the integrated value $I_D g$ to be relatively large, the electric field strength for the gate trench portion 40 can be relaxed, and the breakdown voltage and the withstand capability of the semiconductor device 100 can be improved.

Also, a doping concentration of the first lower end region 202 at the lower end of the gate trench portion 40 is referred to as D1. The doping concentration D1 may be an average value or may be the maximum value obtained by dividing an integrated value $I_D 1$ of a doping concentration of the first lower end region 202 on a line i-i which passes through the lowest point of the gate trench portion 40 and which is parallel to the Z axis, with a width T1 of a depth direction of the lower end from the upper end of the first lower end region 202. The first lower end region 202 may have the same doping concentration at the lower end of the gate trench portion 40 and the lower end of the dummy trench portion 30.

The doping concentration Dg may be greater than the doping concentration D1. The integrated value $I_D g$ may be greater than the integrated value $I_D 1$. In this way, an electric field strength with respect to the gate trench portion 40 in the isolation region 204 can be relaxed. The doping concentration Dg may be twice or more, may be five times or more, or may be ten times or more of the doping concentration D1. Also, the doping concentration Dd may be less than the doping concentration D1. The integrated value $I_D g$ may be twice or more, may be five times or more, or may be ten times or more of the integrated value $I_D 1$. Also, the integrated value $I_D d$ may be less than the integrated value $I_D 1$. Such configuration can cause the electric field of the lower end of each trench portion to be easily equalized. The doping concentration Dd may be 0.5 times or less, may be 0.2 times or less, or may be 0.1 times or less of the doping concentration D1. The integrated value $I_D d$ may be 0.5 times or less, may be 0.2 times or less, or may be 0.1 times or less of the integrated value $I_D 1$.

Also, the number of trench portions in contact with one of the first lower end regions 202 is referred to as q. In the example of FIG. 8, q is an integer greater than or equal to 4. A sum of doping concentrations at the lower end of each trench portion of one of the first lower end regions 202 is referred to as Dsum1. Similarly, the number of trench portions in contact with one of the second lower end regions 205 is referred to as r. In the example of FIG. 8, r is 3. A sum of doping concentrations at the lower end of each trench portion of one of the second lower end regions 205 is referred to as Dsum2. Dsum2/r may be less than Dsum1/q. That is, an average value of each doping concentration at the lower end which is in contact with each trench portion of the one of the second lower end regions 205 may be less than an average value of each doping concentration at the lower end which is in contact with each trench portion of one of the first lower end regions 202.

Also, in each trench portion of one of the first lower end regions 202, a sum of an integrated value of the doping concentration of the first lower end region 202 on a line m-m which passes through the lowest point of each trench portion and which is parallel to the Z axis is referred to as $I_D sum1$. Similarly, the number of trench portions in contact with one of the second lower end regions 205 is referred to as r. In the example of FIG. 8, r is 3.

In each trench portion of one of the second lower end regions 205, a sum of an integrated value of the doping concentration of the first lower end region 202 on a line m-m which passes through the lowest point of each trench portion and which is parallel to the Z axis is referred to as $I_D sum2$. $I_D sum2/r$ may be less than $I_D sum1/q$. That is, the integrated value of the doping concentration of each trench portion in contact with one of the second lower end regions 205 may be less than an integrated value of the doping concentration of each trench portion in contact with one of the first lower end regions 202.

Figure 9B:
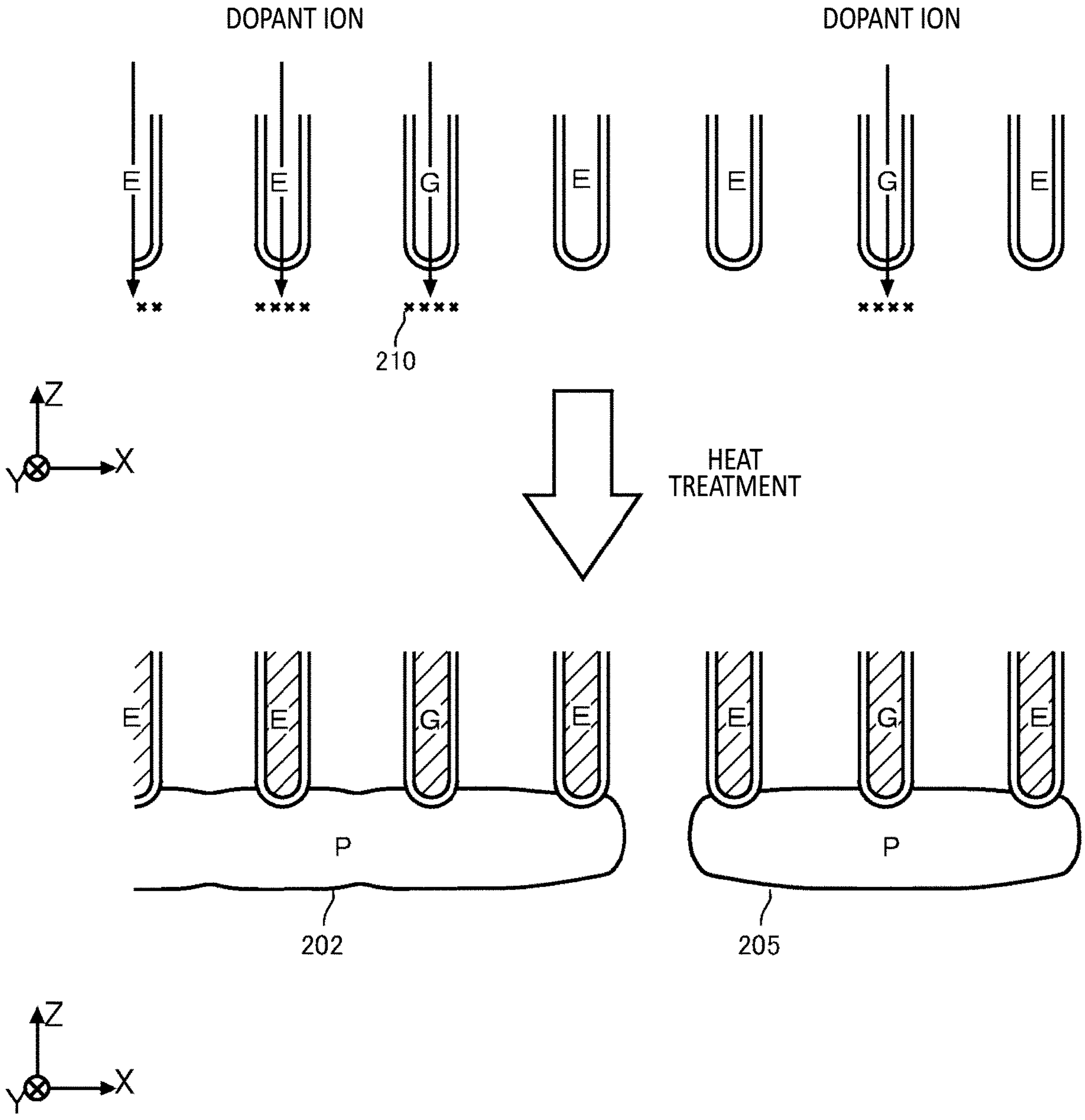
FIG. 9B shows an example of the formation process in FIG. 9A.

FIG. 9B shows an example of the formation process of FIG. 9A. As an example, the first lower end region 202 is formed by implanting a P type dopant 210 by a certain first dose amount to each lower end of the gate trench portion 40 and the dummy trench portion 30. Before forming the gate conductive portion 44 or the dummy conductive portion 34, the P type dopant 210 may be implanted via each trench portion. The upper surface 21 of the semiconductor substrate 10 other than the trench portion may be covered by a mask or the like. By performing heat treatment for the semiconductor substrate 10 after implanting the P type dopant 210, the P type dopant 210 at the lower end of each trench portion diffuses in the Z axis direction, the Y axis direction and the X axis direction, to form the first lower end region 202 in series. The heat treatment may be performed before or after forming the gate conductive portion 44 or the dummy conductive portion 34 to each trench portion. By ion implantation or the like, the P type dopant 210 can be introduced below the trench portion. By the heat treatment, the P type dopant 210 diffuses in a depth direction (the Z axis direction) and a lateral direction (the X axis direction). The P type dopants 210 which are diffused in the lateral direction from below the adjacent trench portion overlap at the center part of the mesa portion. Consequently as shown in FIG. 9B, compared to a portion which overlaps with the trench portion, the first lower end region 202 has a slightly lower doping concentration in the center portion of the mesa portion. Furthermore, an end portion in the lateral direction of the first lower end region 202 may be extended to: a dummy trench portion 30 which is positioned in an −X axis direction end portion on an isolation region 204 side; or alternatively the mesa portion.

On the other hand, in the isolation region 204, a P type dopant 210 may be implanted by a certain first dose amount to the lower end of the gate trench portion 40. By performing heat treatment for the semiconductor substrate 10 after implanting the P type dopant 210, the P type dopant 210 which is implanted to the lower end of the gate trench portion 40 diffuses in the X axis direction, to reach the lower end of the dummy trench portion 30. In this case, an average value of each doping concentration at the lower end of each trench portion of the second lower end region 205 is less than an average value of each doping concentration at the lower end of each trench portion of the first lower end region 202. Such a configuration prevents the second lower end region 205 from being excessively expanded in the X axis direction and being connected to the first lower end region 202 or the well region 11. In the X axis direction, two or more of trench portions to which the P type dopant is not implanted may be arranged between the trench portion forming the P type dopant 210 for forming the first lower end region 202 and the trench portion forming the P type dopant 210 for forming the second lower end region 205.

Figure 10:
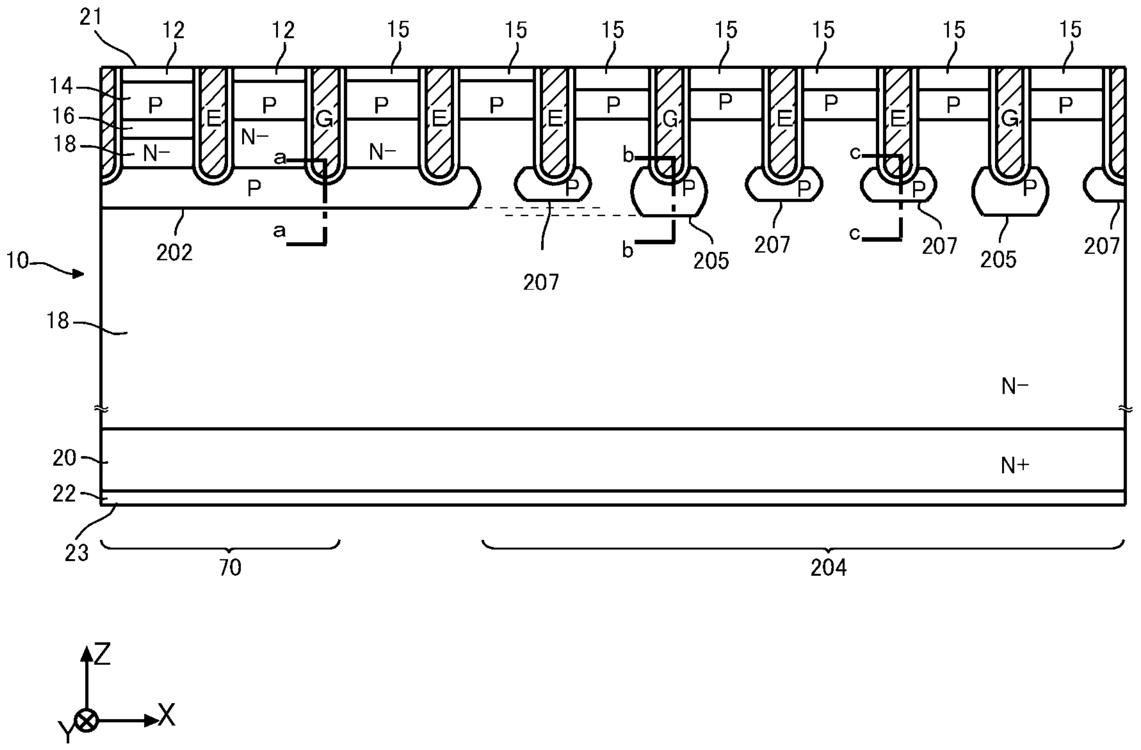
FIG. 10 shows another configuration example of the isolation region 204.

FIG. 10 shows another configuration example of the isolation region 204. The isolation region 204 of the present example is different from the isolation region 204 described in FIG. 1 to FIG. 9B in that it includes the third lower end region 207. The other structures are similar to those of any of the isolation regions 204 described in FIG. 1 to FIG. 9B.

The third lower end region 207 is provided for the one or more dummy trench portions 30 in the isolation region 204. The third lower end region 207 is provided to be in contact with the lower end of the dummy trench portion 30 and is not in contact with the lower end of the trench portion which is adjacent to the dummy trench portion 30. The third lower end region 207 is provided to be separated from all of the first lower end region 202, the second lower end region 205 and the well region 11. An N type region such as a drift region 18 is provided between the third lower end region 207, the first lower end region 202, the second lower end region 205 and the well region 11.

Note that a potential of the third lower end region 207 is different from a potential of the emitter electrode 52. The third lower end region 207 is arranged, in the Z axis direction, apart from the base region 14 which is connected to the emitter electrode 52. Also, the third lower end region 207 is arranged, in a top view, apart from the well region 11 which is connected to the emitter electrode 52. The third lower end region 207 may be an electrically floating region to which no electrode is connected.

The dummy trench portion 30 with which the third lower end region 207 is in contact is arranged adjacent to the gate trench portion 40 with which the second lower end region 205 is in contact. In the present example, the second lower end region 205 is provided for all of the gate trench portions 40 of the isolation region 204, and the third lower end region 207 is provided for all of the dummy trench portions 30 of the isolation region 204. Also by the present example, the electric field strength at the lower end of each trench portion of the isolation region 204 can be relaxed.

Note that, a dose amount of the P type dopant to be implanted below one trench portion when the first lower end region 202 is to be formed may be less than a dose amount of the P type dopant to be implanted below one trench portion when the second lower end region 205 is to be formed. Also, a dose amount of the P type dopant to be implanted below one trench portion when the first lower end region 202 is to be formed may be greater than a dose amount of the P type dopant to be implanted below one trench portion when the third lower end region 207 is to be formed. Note that, a dose amount of the P type dopant to be implanted below one trench portion when the second lower end region 205 is to be formed may be greater than a dose amount of the P type dopant to be implanted below one trench portion when the third lower end region 207 is to be formed.

The lower end position of the first lower end region 202 may be arranged lower than the lower end position of the third lower end region 207. The lower end position of the second lower end region 205 may be arranged lower than the lower end position of the third lower end region 207. The lower end position of the first lower end region 202 may be arranged at a depth position shallower than the lower end position of the second lower end region 205. The lower end position of each lower end region may be a boundary position (PN junction portion) with the drift region 18.

Figure 11:
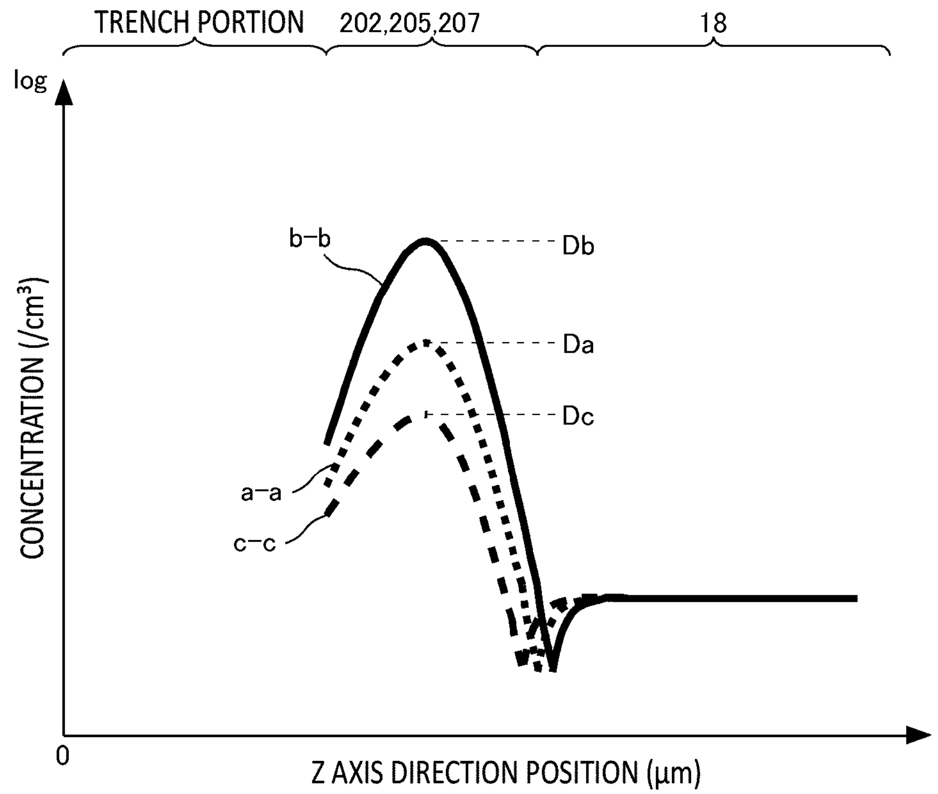
FIG. 11 shows doping concentration distribution examples of the first lower end region 202, the second lower end region 205 and the third lower end region 207 in a Z axis direction.

FIG. 11 shows doping concentration distribution examples of the first lower end region 202, the second lower end region 205 and the third lower end region 207 in a Z axis direction. A doping concentration distribution of the first lower end region 202 is a distribution on the line a-a (see FIG. 10) which passes through the lowest point of the gate trench portion 40 and which is parallel to the Z axis. A doping concentration distribution of the second lower end region 205 is a distribution on the line b-b (see FIG. 10) which passes through the lowest point of the gate trench portion 40 and which is parallel to the Z axis. A doping concentration distribution of the third lower end region 207 is a distribution on the line c-c (see FIG. 10) which passes through the lowest point of the dummy trench portion 30 and which is parallel to the Z axis.

A peak value of the doping concentration of the first lower end region 202 is referred to as Da, a peak value of the doping concentration of the second lower end region 205 is referred to as Db, and a peak value of the doping concentration of the third lower end region 207 is referred to as Dc. The peak value Db may be greater than the peak value Da. The peak value Db may be twice or more, may be five times or more, or may be ten times or more of the peak value Da. The peak value Da may be greater than the peak value Dc. The doping concentration Da may be twice or more, may be five times or more, or may be ten times or more of the doping concentration Dc. At the PN junction of the drift region 18, the second lower end region 205 may be positioned at a position which is the closest to the lower surface 23 side (+Z axis direction side), and the third lower end region 207 may be positioned at a position which is the closest to the upper surface 21 side (−Z axis direction side).

Also, an integrated value which is obtained by integrating the doping concentration of the first lower end region 202 from the lower end of the gate trench portion 40 to the upper end of the drift region 18 is referred to as Ia, an integrated value which is obtained by integrating the doping concentration of the second lower end region 205 from the lower end of the gate trench portion 40 to the upper end of the drift region 18 is referred to as Ib, and an integrated value which is obtained by integrating the doping concentration of the third lower end region 207 from the lower end of the dummy trench portion 30 to the upper end of the drift region 18 is referred to as Ic. The integrated value Ib may be greater than the integrated value Ia. The integrated value Ib may be twice or more, may be five times or more, or may be ten times or more of the integrated value Ia. The integrated value Ia may be greater than the integrated value Ic. The integrated value Ia may be twice or more, may be five times or more, or may be ten times or more of the integrated value Ic.

Note that the doping concentration distribution on the line i-i in FIG. 9A may be similar to the doping concentration distribution on the line a-a of the present example. Note that the doping concentration distribution on the line m-m in FIG. 9A may be similar to the doping concentration distribution on the line b-b of the present example. The doping concentration distribution on the line k-k in FIG. 9A may be similar to the doping concentration distribution on the line c-c of the present example.

Figure 12:
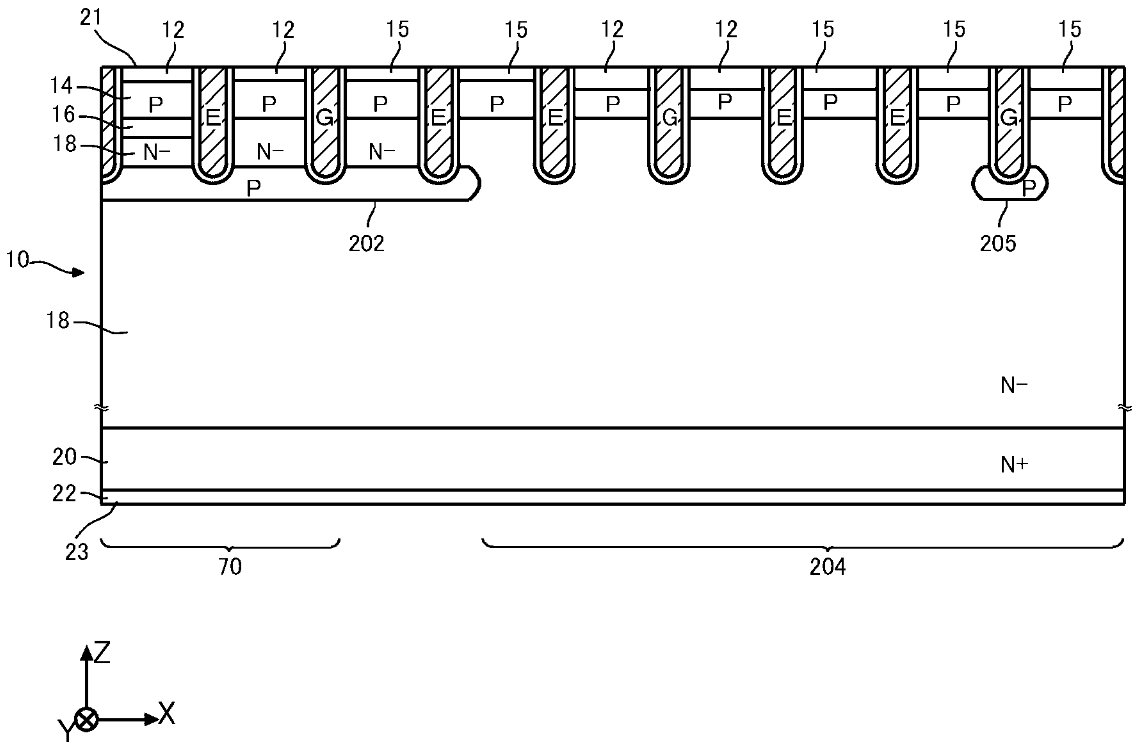
FIG. 12 shows another example of the isolation region 204.

FIG. 12 shows another example of the isolation region 204. The isolation region 204 of the present example has an arrangement of the second lower end region 205 which is different from the example described in FIG. 1 to FIG. 11. Other structures are similar to any of the examples described in FIGS. 1 to 11.

In the isolation region 204 of the present example, a lower end of at least one of the gate trench portions 40 is not provided with the second lower end region 205. That is, at least the lower end of the gate trench portion 40 is in contact with an N type region such as a drift region 18. In the isolation region 204, in a mesa portion which is in contact with the gate trench portion 40 which is not provided with the second lower end region 205, an emitter region 12 may be provided. In this way, when the gate trench portion 40 which is not provided with the second lower end region 205 is in an ON state, electrons can be easily supplied for the drift region 18. In this way, the carrier concentration in the drift region 18 can be increased and the ON resistance can be reduced.

Among the gate trench portions 40 of the isolation region 204, the lower end of the gate trench portion 40 which is the closest to the first lower end region 202 may be in in contact with the drift region 18. In this way, electrons can be supplied in the vicinity of the transistor portion 70.

Figure 13:
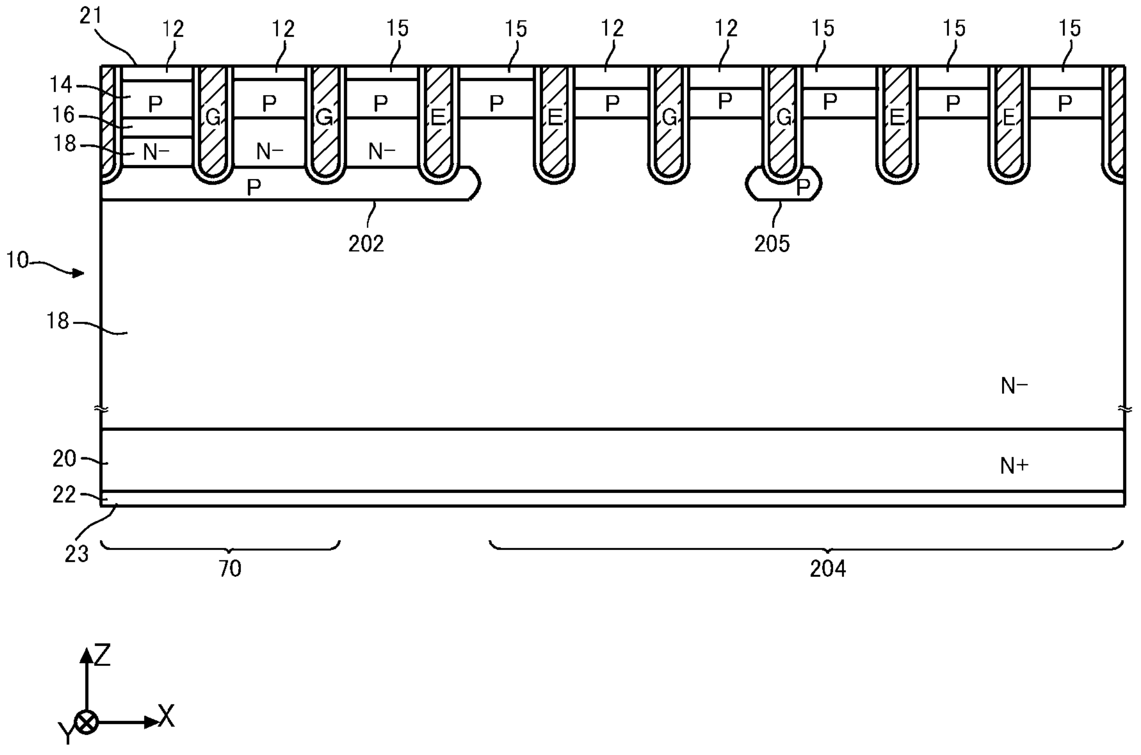
FIG. 13 shows another example of the isolation region 204.

FIG. 13 shows another example of the isolation region 204. In the semiconductor substrate 10 of the present example, two gate trench portions 40 and two dummy trench portions 30 are arranged alternately. That is, the semiconductor substrate 10 has two gate trench portions 40 arranged adjacent to each other without sandwiching the dummy trench portion 30 therebetween in the X axis direction, and two dummy trench portions 30 arranged adjacent to each other without sandwiching the gate trench portion 40 therebetween. The structure other than the array of the trench portions is similar to any of the examples described in FIG. 1 to FIG. 12.

In the isolation region 204 of the present example, a lower end of at least one of the gate trench portions 40 is not provided with the second lower end region 205. In the present example, among two gate trench portions 40 arranged in series, one gate trench portion 40 is provided with the second lower end region 205 and the other gate trench portion 40 is not provided with the second lower end region 205. By such a configuration, the electron supply function can be maintained while relaxing the electric field strength with respect to a pair of gate trench portions 40. Among the pair of gate trench portions 40, the gate trench portion 40 which is farther from the transistor portion 70 is provided with the second lower end region 205 and the gate trench portion 40 which is closer to the transistor portion 70 may not be provided with the second lower end region 205. In this way, electrons can be supplied relatively near the transistor portion 70 while relaxing the electric field strength.

Figure 14:
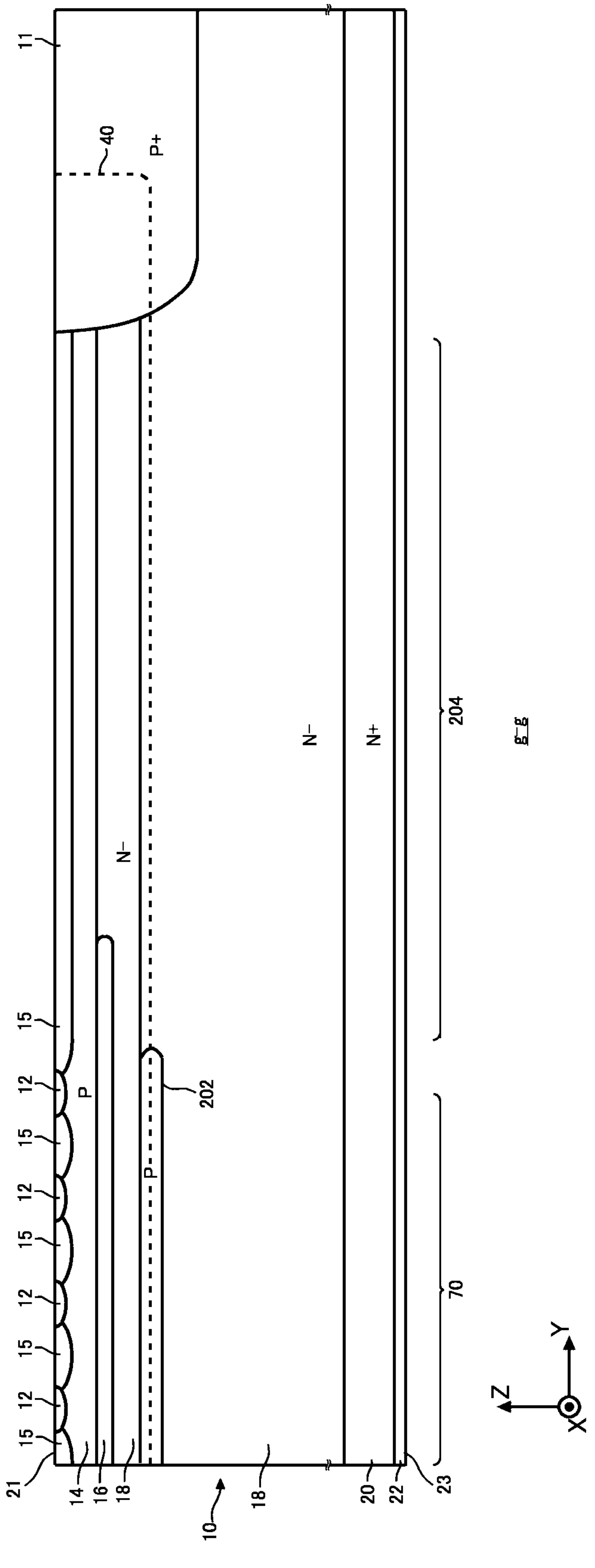
FIG. 14 shows an example of the cross section g-g in FIG. 4.

FIG. 14 shows an example of a cross section g-g in FIG. 4. The cross section g-g is a YZ plane which passes through the first lower end region 202 and the well region 11. The cross section g-g passes through a mesa portion of the transistor portion 70. However, in FIG. 14, a position at which the gate trench portion 40 is projected on the cross section g-g is indicated by a dashed line. Note that FIG. 14 shows a structure of the semiconductor substrate 10 and omits components such as an electrode and a dielectric film arranged above and below the semiconductor substrate 10.

In the cross section, the isolation region 204 is also provided between the transistor portion 70 and the well region 11. However, the isolation region 204 in the cross section is not provided with the second lower end region 205 and the third lower end region 207. The drift region 18 is provided between the first lower end region 202 and the well region 11.

The emitter region 12 and the contact region 15 are alternately arranged along the Y axis direction in the upper surface 21 of the transistor portion 70. The contact region 15 is provided in the upper surface 21 of the isolation region 204.

The accumulation region 16 of this example is provided to extend closer to the well region 11 than an end portion of the transistor portion 70. In another example, the accumulation region 16 may be terminated at the end portion of the transistor portion 70 or may be terminated inside the transistor portion 70.

The first lower end region 202 of the present example extends closer to the well region 11 than the end portion of the transistor portion 70. In another example, the first lower end region 202 may be terminated at the end portion of the transistor portion 70 or may be terminated inside the transistor portion 70. The accumulation region 16 may extend to a position which is closer to the well region 11 than the first lower end region 202.

The isolation region 204 may overlap with the accumulation region 16 in a top view. That is, the end portion of the accumulation region 16 may exist inside the isolation region 204 in a top view. In another example, the isolation region 204 may not overlap with the accumulation region 16 in a top view. That is, the end portion of the accumulation region 16 may exist inside (−Y axis direction side) from the isolation region 204 in a top view. In the cross section, the isolation region 204 may be provided not to overlap with the transistor portion 70. In another example, in the cross section, the isolation region 204 may overlap with the transistor portion 70.

Figure 15:
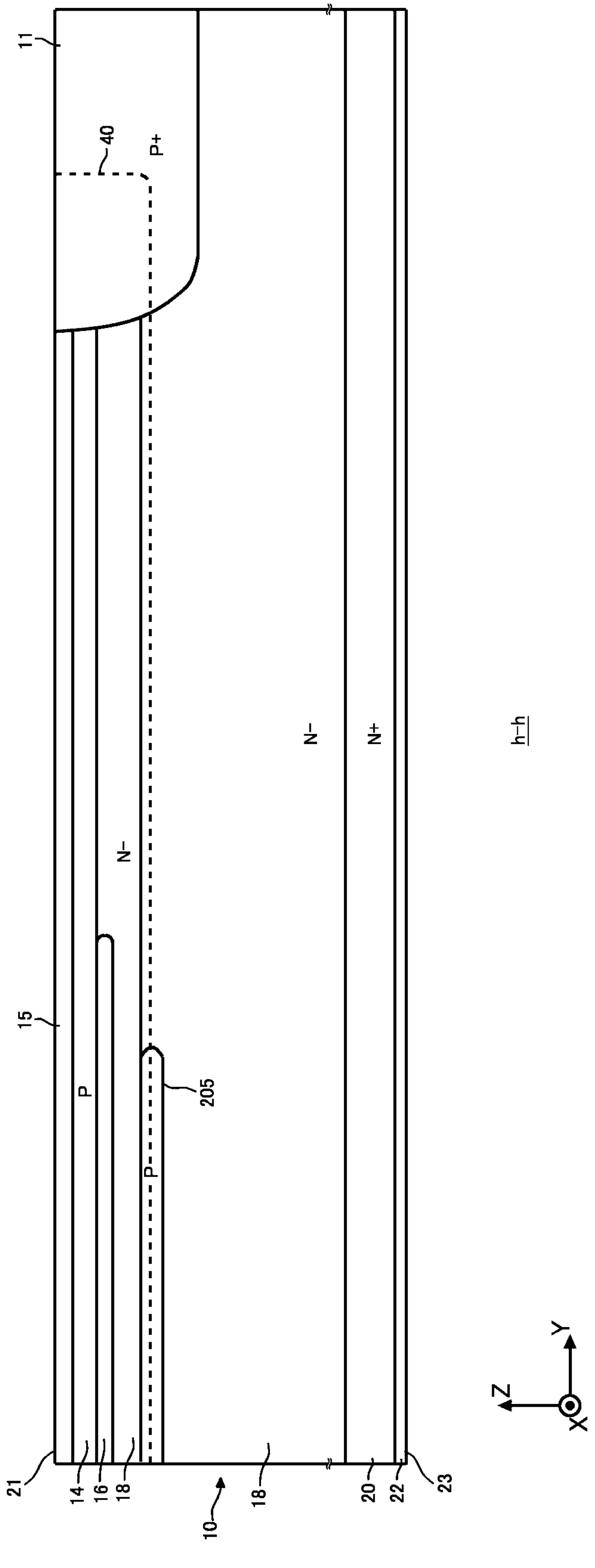
FIG. 15 shows an example of the cross section h-h in FIG. 5.

FIG. 15 shows an example of the cross section h-h in FIG. 5. The cross section h-h is a YZ plane which passes through the second lower end region 205 and the well region 11. A position in the Y axis direction of the cross section h-h is the same as that of the cross section g-g shown in FIG. 14. The cross section h-h passes through the mesa portion of the isolation region 204. However, in FIG. 15, a position at which the gate trench portion 40 is projected on the cross section h-h is indicated by a dashed line. Note that FIG. 15 shows a structure of the semiconductor substrate 10 and omits components such as an electrode and a dielectric film arranged above and below the semiconductor substrate 10.

The semiconductor substrate 10 of the cross section is provided with the second lower end region 205 instead of the first lower end region 202 in the cross section shown in FIG. 14. Also, the contact regions 15 are provided in series on the upper surface 21 of the semiconductor substrate 10. Other structures are similar to those of the example described in FIG. 14. In the Y axis direction, a distance between the second lower end region 205 and the well region 11 may be the same as, may be greater than, or may be less than a distance between the first lower end region 202 and the well region 11.

Figure 16:
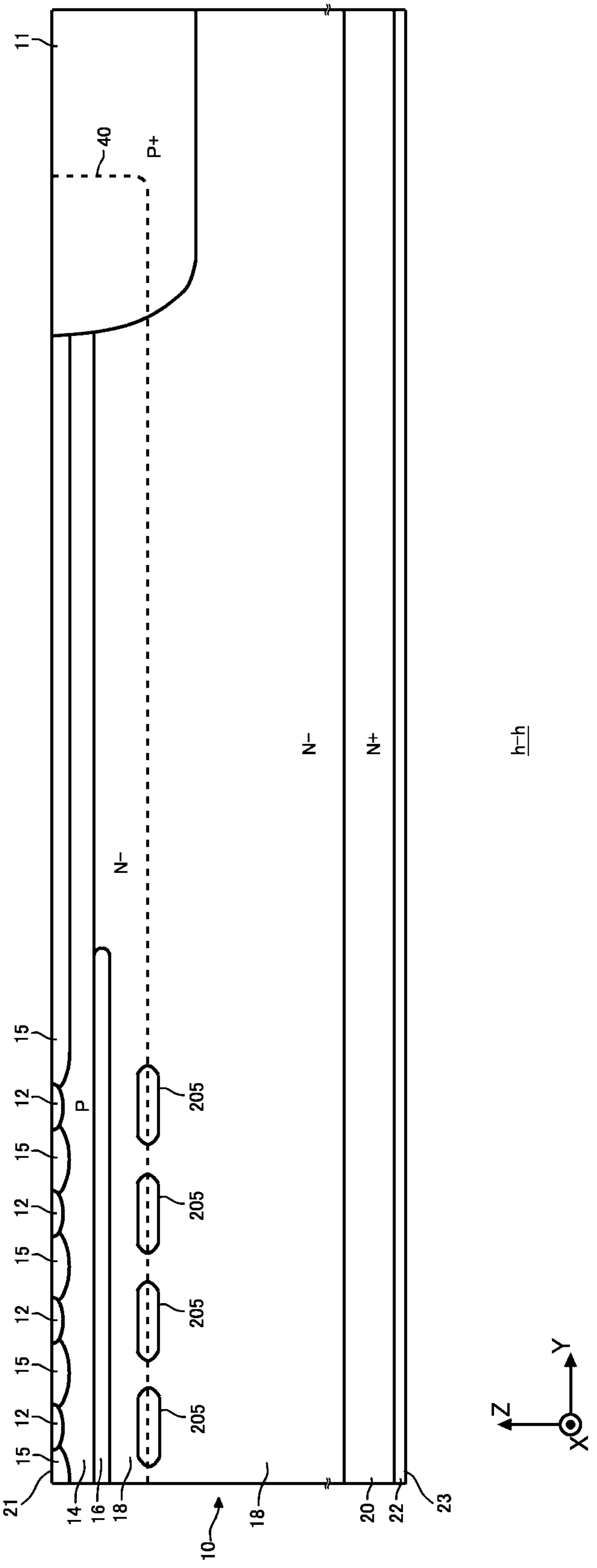
FIG. 16 shows an example of the cross section h-h in FIG. 5.

FIG. 16 shows another example of the cross section h-h. In the cross section h-h of the present example, a structure on the upper surface 21 of the semiconductor substrate 10 is similar to the cross section g-g shown in FIG. 14. That is, the emitter region 12 and the contact region 15 are arranged alternately along the Y axis direction.

In the present example, a plurality of second lower end regions 205 are arranged discretely and apart from each other along a longitudinal direction of the gate trench portion 40 (the Y axis direction). Structures other than the structure in the upper surface 21 of the semiconductor substrate 10 and the arrangement of the second lower end region 205 are similar to the example of FIG. 15. While relaxing the electric field strength by arranging the second lower end region 205 along the Y axis direction, the electron supply function can be maintained by discretely arranging the second lower end region 205. Note that the first lower end region 202 is preferably arranged in series in the Y axis direction as shown in FIG. 14. In this way, the voltage or current waveform noise during switching can be reduced in a wide range of the transistor portion 70 and the diode portion 80.

Each second lower end region 205 may be arranged to overlap with the emitter region 12 in a top view. The second lower end region 205 may be provided for each emitter region 12. Each second lower end region 205 may be arranged to cover the entire corresponding emitter region 12 in the Y axis direction. Since the electron current flows toward the emitter region 12, a relatively large current flows below the emitter region 12. By providing the second lower end region 205 below the emitter region 12, the electric field of a region in which a large current is flowing can be suppressed, and the withstand capability of the region can be improved.

In FIG. 15 and FIG. 16, a structure of the second lower end region 205 near the gate trench portion 40 in the Y axis direction is described, but the second lower end region 205 in the other regions has a similar structure in the Y axis direction. Also, the third lower end region 207 may have a structure in the Y axis direction which is similar to that of the second lower end region 205 described in FIG. 15 and FIG. 16.

Figure 17:
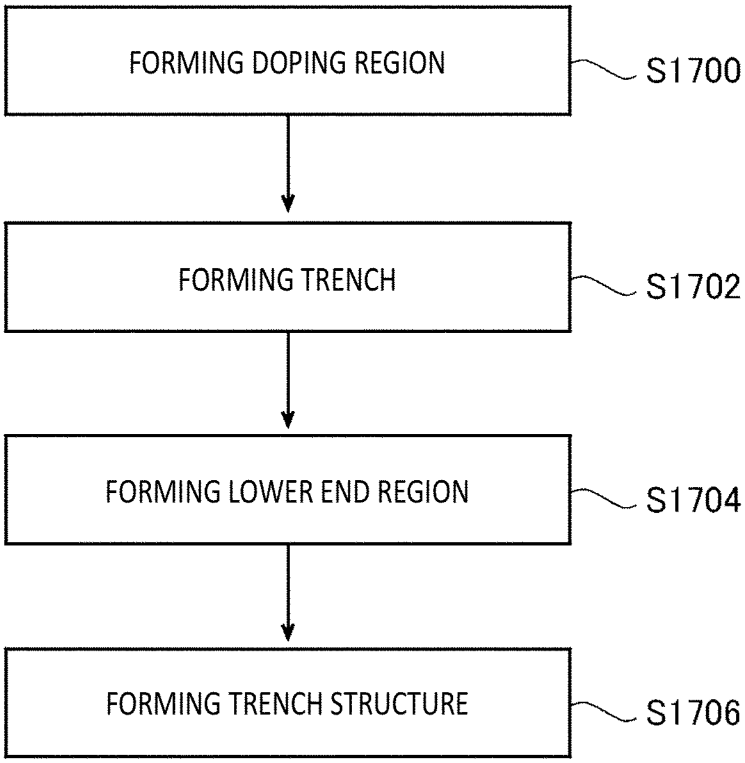
FIG. 17 shows a partial process of a manufacturing method of the semiconductor device 100.

FIG. 17 shows a part of the process of the manufacturing method of the semiconductor device 100. In the manufacturing method of the semiconductor device 100, each configuration described in FIG. 1 to FIG. 16 is formed. The process shown in FIG. 17 includes a doping region forming step S1700, a trench forming step S1702, a lower end region forming step S1704 and a trench structure forming step S1706.

In the doping region forming step S1700, a doping region arranged on an upper surface 21 side of a semiconductor substrate 10 is formed. The doping region includes, for example, at least one of the well region 11, the emitter region 12, the base region 14, the contact region 15, or the accumulation region 16. Note that the drift region 18 may be a region remaining without the above described doping regions formed.

The trench forming step S1702 forms a trench in the upper surface 21 of the semiconductor substrate 10. The trench is a groove for forming each trench portion. Each trench is formed from the upper surface 21 to a depth reaching the drift region 18. The trench forming step S1702 does not form at least a conductive portion in the trench. A dielectric film in the trench may be formed or may not be formed.

The lower end region forming step S1704 forms a first lower end region 202 and a second lower end region 205. The lower end region forming step S1704 may form a third lower end region 207. The lower end region forming step S1704 may implant a P type dopant ion to the semiconductor substrate 10 via the trench. In the lower end region forming step S1704, the P type dopant ion may be implanted from the upper surface 21 of the semiconductor substrate 10 in a state in which the portions other than the trench are masked. This allows the dopant ion of the P type to be easily implanted into a region in contact with a lower end of the trench. In the doping region forming step S1700 and the lower end region forming step S1704, a heat treatment is performed for the semiconductor substrate 10 after the dopant is implanted.

The trench structure forming step S1706 forms the conductive portion and the dielectric film inside each trench. The trench structure forming step S1706 may form the dielectric film by thermally oxidizing an inner wall of the trench. The trench structure forming step S1706 may form the conductive portion by filling a conductive material such as polysilicon into the trench where the dielectric film is formed.

Figure 18:
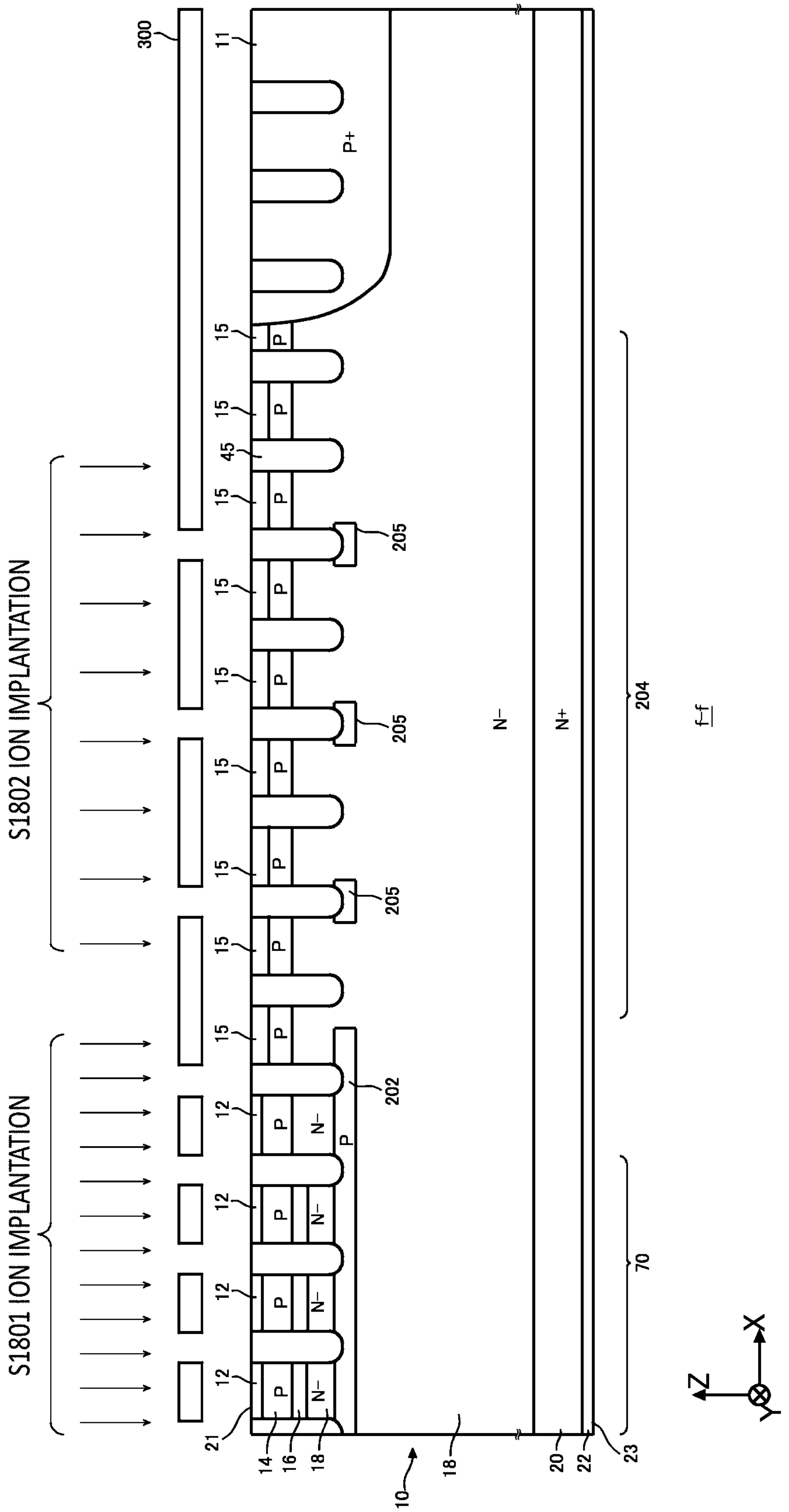
FIG. 18 illustrates an example of a lower end region forming step S1704.

FIG. 18 illustrates an example of the lower end region forming step S1704. The lower end region forming step S1704 of the present example includes a first implantation step S1801 and a second implantation step S1802. Any one of the first implantation step S1801 and the second implantation step S1802 may be performed before the other one, or the two may be performed simultaneously.

In the first implantation step S1801, a P type dopant ion is implanted to a region in which a first lower end region 202 should be formed with a predetermined concentration (/cm$^2$). In the first implantation step S1801 of the present example, the P type dopant ion is implanted from a bottom portion of each trench 45 of the gate trench portion 40 and the dummy trench portion 30.

In the second implantation step S1802, the P type dopant ion is implanted to a region in which the isolation region 204 should be formed. In the second implantation step S1802 of the present example, the P type dopant ion is implanted from the bottom portion of each trench 45 of the gate trench portion 40. A dose amount (ions/cm$^2$) per unit area in the second implantation step S1802 may be the same as, or may be different from a dose amount (ions/cm$^2$) in the first implantation step S1801. When the first implantation step S1801 and the second implantation step S1802 is performed simultaneously, these dose amounts are the same. In the first implantation step S1801 and the second implantation step S1802, a mask 300 may mask a region other than the trench 45. Heat treatment diffuses the dopant implanted via the trench 45. In this way, first lower end regions 202 can be formed in series in an XY plane. Also, depending on the conditions of the heat treatment, whether the second lower end region 205 is to be formed to reach the lower end of the adjacent trench 45 can be controlled.

The manufacturing method may further include a third implantation step for forming the third lower end region 207. When a doping concentration of the third lower end region 207 is made to be different from a doping concentration of the second lower end region 205, the third implantation step is performed with a different process from the second implantation step S1802.

While the present invention has been described by way of the embodiments, the technical scope of the present invention is not limited to the scope described in the above-described embodiments. It is apparent to persons skilled in the art that various alterations or improvements can be made to the above-described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, embodiments, or drawings can be realized in any order as long as the order is not indicated by "prior to," "before," or the like and as long as the output from a previous process is not used in a later process. Even if the operation flow is described using phrases such as "first" or "next" in the claims, embodiments, or drawings for convenience, it does not necessarily mean that the process must be performed in this order.

What is claimed is:

1. A semiconductor device comprising:

a semiconductor substrate that has an upper surface and a lower surface, and includes a drift region of a first conductivity type;

a base region of a second conductivity type that is provided between the drift region and the upper surface of the semiconductor substrate;

a plurality of trench portions that are provided from the upper surface of the semiconductor substrate to below the base region, and include a gate trench portion and a dummy trench portion;

a first lower end region of the second conductivity type that is provided to be in contact with lower ends of two or more trench portions which include the gate trench portion;

a well region of the second conductivity type that is arranged in a different location from the first lower end region in a top view, provided from the upper surface of the semiconductor substrate to below the base region, and has a doping concentration higher than that of the base region; and a second lower end region of the second conductivity type that is provided between the first lower end region and the well region in a top view being separated from the first lower end region and the well region, and provided to be in contact with lower ends of one or more trench portions including the gate trench portion, wherein the first lower end region and the second lower end region are formed entirely below the base region in a depth direction.

2. The semiconductor device according to claim 1, wherein the number of the trench portions in contact with one of second lower end regions, each being identical to the second lower end region, is less than the number of the trench portions in contact with one of first lower end regions, each being identical to the first lower end region.

3. The semiconductor device according to claim 1, wherein one of second lower end regions, each being identical to the second lower end region, is in contact with a lower end of one of gate trench portions, each being identical to the gate trench portion, and is not in contact with a lower end of the gate trench portion other than that of the one of the gate trench portions.

4. The semiconductor device according to claim 3, wherein one of first lower end regions, each being identical to the first lower end region, is in contact with lower ends of a plurality of gate trench portions, each being identical to the gate trench portion, and a plurality of dummy trench portions, each being identical to the dummy trench portion.

5. The semiconductor device according to claim 3, wherein one of the second lower end regions, each being identical to the second lower end region, is in contact with a lower end of one of the gate trench portions, each being identical to the gate trench portion, and is not in contact with a lower end of the trench portion that is arranged adjacent to the gate trench portion.

6. A semiconductor device, comprising:

a semiconductor substrate that has an upper surface and a lower surface, and includes a drift region of a first conductivity type;

a base region of a second conductivity type that is provided between the drift region and the upper surface of the semiconductor substrate;

a plurality of trench portions that are provided from the upper surface of the semiconductor substrate to below the base region, and include a gate trench portion and a dummy trench portion;

a first lower end region of the second conductivity type that is provided to be in contact with lower ends of two or more trench portions which include the gate trench portion;

a well region of the second conductivity type that is arranged in a different location from the first lower end region in a top view, provided from the upper surface of the semiconductor substrate to below the base region, and has a doping concentration higher than that of the base region; and a second lower end region of the second conductivity type that is provided between the first lower end region and the well region in a top view being separated from the first lower end region and the well region, and provided to be in contact with lower ends of one or more trench portions including the gate trench portion, wherein one of second lower end regions, each being identical to the second lower end region, is in contact with a lower end of one of gate trench portions, each being identical to the gate trench portion, and is in contact with a lower end of the dummy trench portion that is arranged adjacent to the gate trench portion.

7. The semiconductor device according to claim 1, wherein a doping concentration of the second lower end region at the lower end of the gate trench portion is greater than a doping concentration of the first lower end region at the lower end of the gate trench portion.

8. The semiconductor device according to claim 6, wherein a doping concentration of the second lower end region at the lower end of the gate trench portion is greater than a doping concentration of the first lower end region at the lower end of the gate trench portion, and a doping concentration of the second lower end region at the lower end of the dummy trench portion is less than a doping concentration of the first lower end region at the lower end of the gate trench portion.

9. The semiconductor device according to claim 6, wherein an average value of each doping concentration at the lower end of each trench portion of one of the second lower end regions is less than an average value of each doping concentration at the lower end of each trench portion of one of first lower end regions, each being identical to the first lower end region.

10. The semiconductor device according to claim 5, further comprising a third lower end region of the second conductivity type that is provided to be in contact with the lower end of the dummy trench portion, wherein the dummy trench portion that is in contact with the third lower end region is arranged adjacent to the gate trench portion that is in contact with the second lower end region, and the third lower end region is separated from all of the first lower end region, the second lower end region and the well region.

11. The semiconductor device according to claim 10, wherein a doping concentration of the third lower end region at the lower end of the dummy trench portion is less than a doping concentration of the second lower end region at the lower end of the gate trench portion.

12. The semiconductor device according to claim 1, wherein a plurality of second lower end regions, each being identical to the second lower end region, are arranged apart from each other along a longitudinal direction of the gate trench portion.

13. The semiconductor device according to claim 12, further comprising:

an emitter region of the first conductivity type that is exposed on the upper surface of the semiconductor substrate, is provided to be in contact with the gate trench portion, and has a doping concentration higher than that of the drift region; and a contact region of the second conductivity type that is exposed on the upper surface of the semiconductor substrate, is alternately arranged with the emitter region along the longitudinal direction of the gate trench portion, and has a doping concentration higher than that of the base region; wherein the second lower end region is arranged to overlap with the emitter region in a top view.

14. The semiconductor device according to claim 1, wherein for each of two or more of the gate trench portions, the second lower end region being separated from each other is provided.

15. A semiconductor device, comprising:

a semiconductor substrate that has an upper surface and a lower surface, and includes a drift region of a first conductivity type;

a base region of a second conductivity type that is provided between the drift region and the upper surface of the semiconductor substrate;

a plurality of trench portions that are provided from the upper surface of the semiconductor substrate to below the base region, and include a gate trench portion and a dummy trench portion;

a first lower end region of the second conductivity type that is provided to be in contact with lower ends of two or more trench portions which include the gate trench portion;

a well region of the second conductivity type that is arranged in a different location from the first lower end region in a top view, provided from the upper surface of the semiconductor substrate to below the base region, and has a doping concentration higher than that of the base region; and a second lower end region of the second conductivity type that is provided between the first lower end region and the well region in a top view being separated from the first lower end region and the well region, and provided to be in contact with lower ends of one or more trench portions including the gate trench portion, wherein among a plurality of gate trench portions, each being identical to the gate trench portion, provided between the first lower end region and the well region, the lower end of at least one of the gate trench portions is in contact with a first conductivity type region.

16. The semiconductor device according to claim 15, wherein the lower end of the gate trench portion that is the closest to the first lower end region is in contact with the first conductivity type region.

17. The semiconductor device according to claim 15, wherein among two of the gate trench portions arranged adjacent to each other without having the dummy trench portion sandwiched therebetween, the second lower region is provided to be in contact with the lower end of one of the gate trench portions, and the lower end of the other one of the gate trench portions is in contact with the first conductivity type region.

18. The semiconductor device according to claim 2, wherein one of second lower end regions, each being identical to the second lower end region, is in contact with a lower end of one of gate trench portions, each being identical to the gate trench portion, and is in contact with a lower end of the dummy trench portion that is arranged adjacent to the gate trench portion.

19. The semiconductor device according to claim 3, wherein one of second lower end regions, each being identical to the second lower end region, is in contact with a lower end of one of gate trench portions, each being identical to the gate trench portion, and is in contact with a lower end of the dummy trench portion that is arranged adjacent to the gate trench portion.

20. The semiconductor device according to claim 4, wherein one of second lower end regions, each being identical to the second lower end region, is in contact with a lower end of one of gate trench portions, each being identical to the gate trench portion, and is in contact with a lower end of the dummy trench portion that is arranged adjacent to the gate trench portion.

* * * * *